US008773902B2

(12) United States Patent
Dutta et al.

(10) Patent No.: US 8,773,902 B2
(45) Date of Patent: Jul. 8, 2014

(54) CHANNEL BOOSTING USING SECONDARY NEIGHBOR CHANNEL COUPLING IN NON-VOLATILE MEMORY

(75) Inventors: Deepanshu Dutta, San Jose, CA (US); Shinji Sato, Chigasaki (JP); Fumiko Yano, Yokkaishi (JP)

(73) Assignee: SanDisk Technologies Inc., Plano, TX (US)

( * ) Notice: Subject to any disclaimer, the term of this patent is extended or adjusted under 35 U.S.C. 154(b) by 236 days.

(21) Appl. No.: 13/467,289

(22) Filed: May 9, 2012

(65) Prior Publication Data

US 2013/0301351 A1     Nov. 14, 2013

(51) Int. Cl.
*G11C 11/34*     (2006.01)
*G11C 16/34*     (2006.01)
*G11C 16/10*     (2006.01)
*G11C 16/04*     (2006.01)

(52) U.S. Cl.
CPC ........ *G11C 16/3418* (2013.01); *G11C 16/0483* (2013.01); *G11C 16/10* (2013.01); *G11C 16/3427* (2013.01)
USPC .................................................... 365/185.02

(58) Field of Classification Search
CPC ............... G11C 11/5628; G11C 16/10; G11C 16/3427; G11C 16/0475
USPC ................. 365/185.02, 185.09, 206
See application file for complete search history.

(56) References Cited

U.S. PATENT DOCUMENTS

| 5,973,961 | A | 10/1999 | Park et al. |
| 6,608,783 | B2 | 8/2003 | Frankowsky et al. |
| 6,876,596 | B1 | 4/2005 | Kirihara |
| 7,551,466 | B2 | 6/2009 | Aritome |
| 7,668,012 | B2 | 2/2010 | Aritome |
| 7,948,805 | B2 | 5/2011 | Won et al. |
| 8,116,140 | B2 | 2/2012 | Dong et al. |
| 2003/0117869 | A1 | 6/2003 | Hidaka |

(Continued)

FOREIGN PATENT DOCUMENTS

WO    WO 2010/051116 A1    5/2010

OTHER PUBLICATIONS

Lee, et al., "A 64Gb 533Mb/s DDR Interface MLC NAND Flash in Sub-20nm Technology," IEEE International Solid-State Circuits Conference, Feb. 2012, 3 pages.

(Continued)

*Primary Examiner* — Toan Le
*Assistant Examiner* — Ajay Ojha
(74) *Attorney, Agent, or Firm* — Vierra Magen Marcus LLP

(57) ABSTRACT

In a non-volatile storage system, a programming portion of a program-verify iteration has multiple programming pulses, and storage elements along a word line are selected for programming according to a pattern. Unselected storage elements are grouped to benefit from channel-to-channel capacitive coupling from both primary and secondary neighbor storage elements. The coupling is helpful to boost channel regions of the unselected storage elements to a higher channel potential to prevent program disturb. Each selected storage element has a different relative position within its set. For example, during a first programming pulse, first, second and third storage elements are selected in first, second and third sets, respectively. During a second programming pulse, second, third and first storage elements are selected in the first, second and third sets, respectively. During a third programming pulse, third, first and second storage elements are selected in the first, second and third sets, respectively.

21 Claims, 19 Drawing Sheets

(56) References Cited

U.S. PATENT DOCUMENTS

| | | |
|---|---|---|
| 2007/0279989 A1 | 12/2007 | Aritome |
| 2008/0126676 A1* | 5/2008 | Li et al. .......... 711/103 |
| 2008/0253193 A1 | 10/2008 | Cernea |
| 2008/0298124 A1 | 12/2008 | Wong |
| 2009/0059660 A1 | 3/2009 | Lee et al. |
| 2009/0168538 A1 | 7/2009 | Lee |
| 2010/0110792 A1 | 5/2010 | Lutze et al. |
| 2011/0032757 A1 | 2/2011 | Dutta et al. |

OTHER PUBLICATIONS

International Search Report & The Written Opinion of the International Searching Authority dated Oct. 1, 2013, International Application No. PCT/US2013/038596.

* cited by examiner

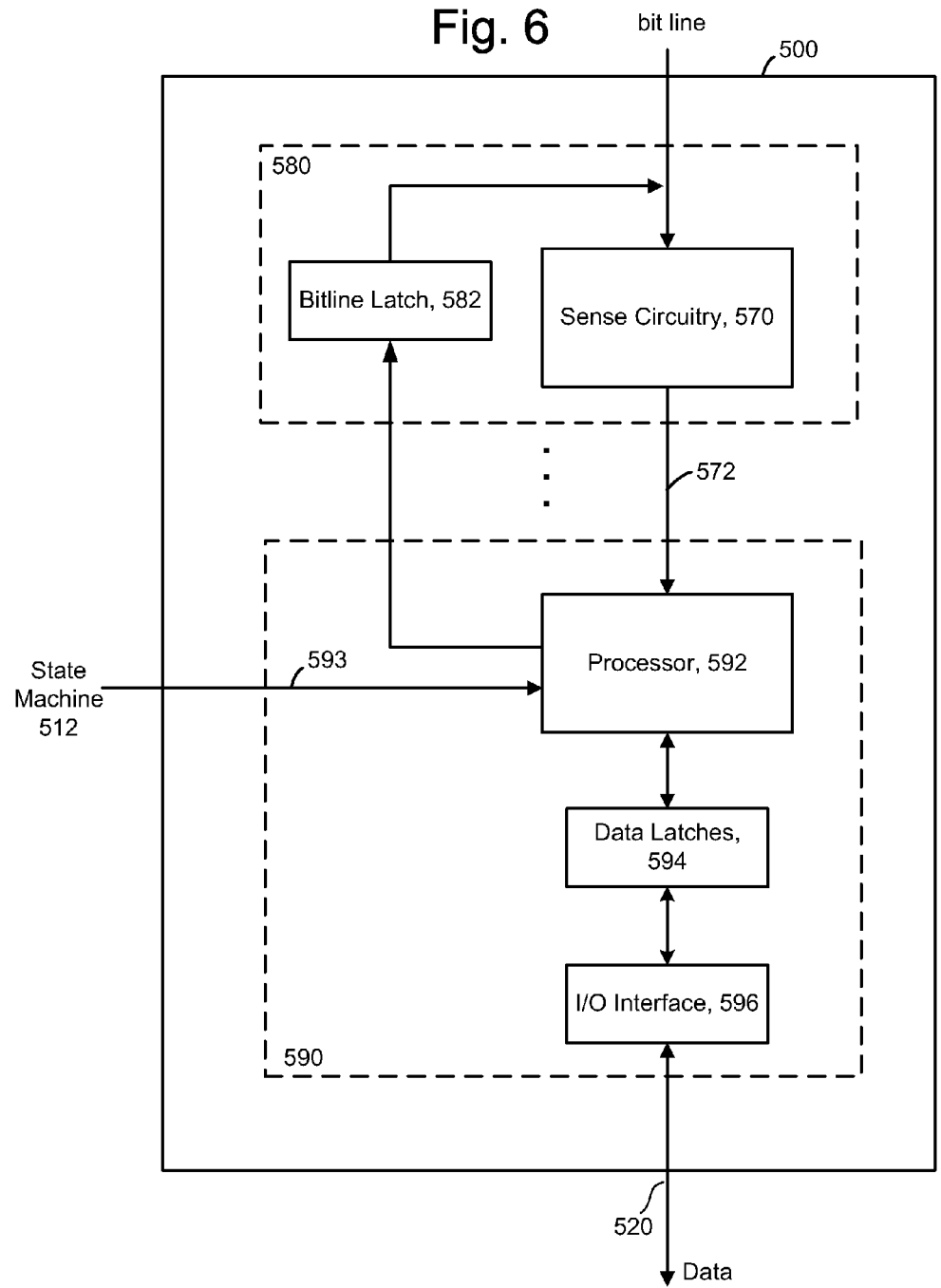

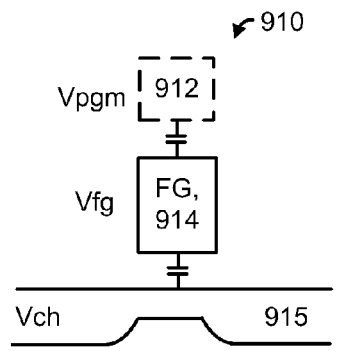
Fig. 9A
Fig. 9B
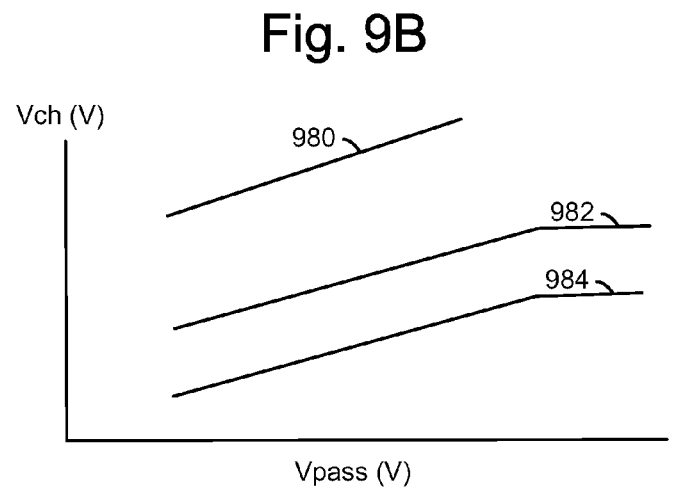
Fig. 9C
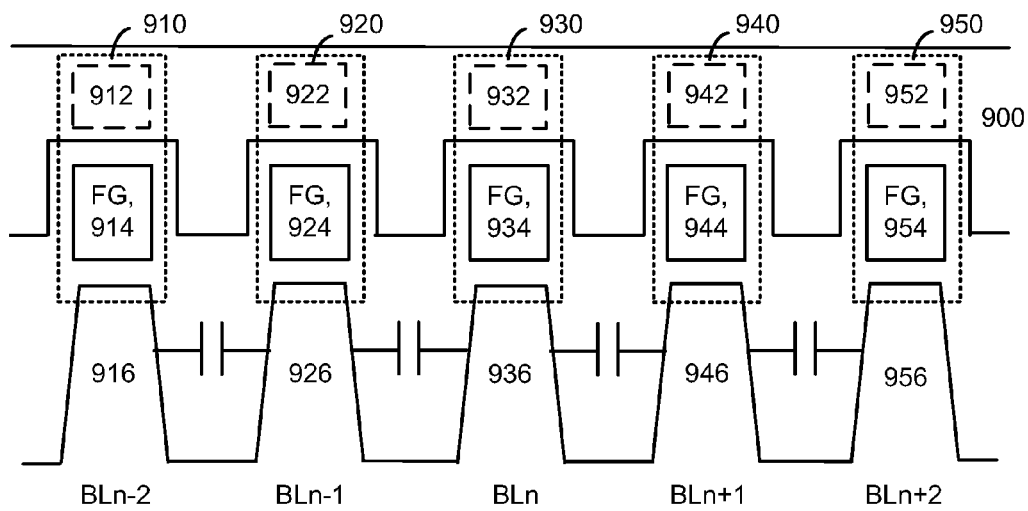

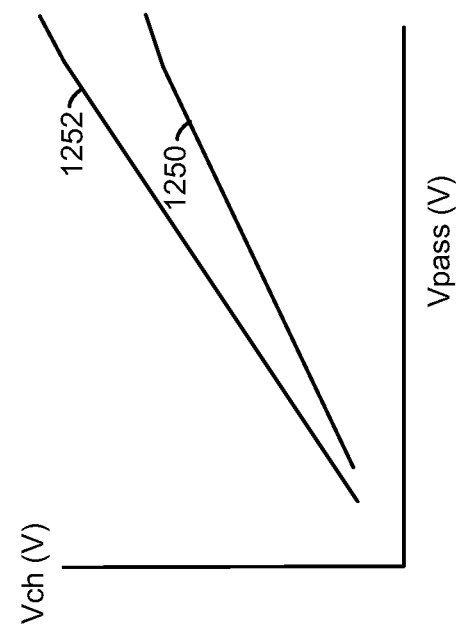

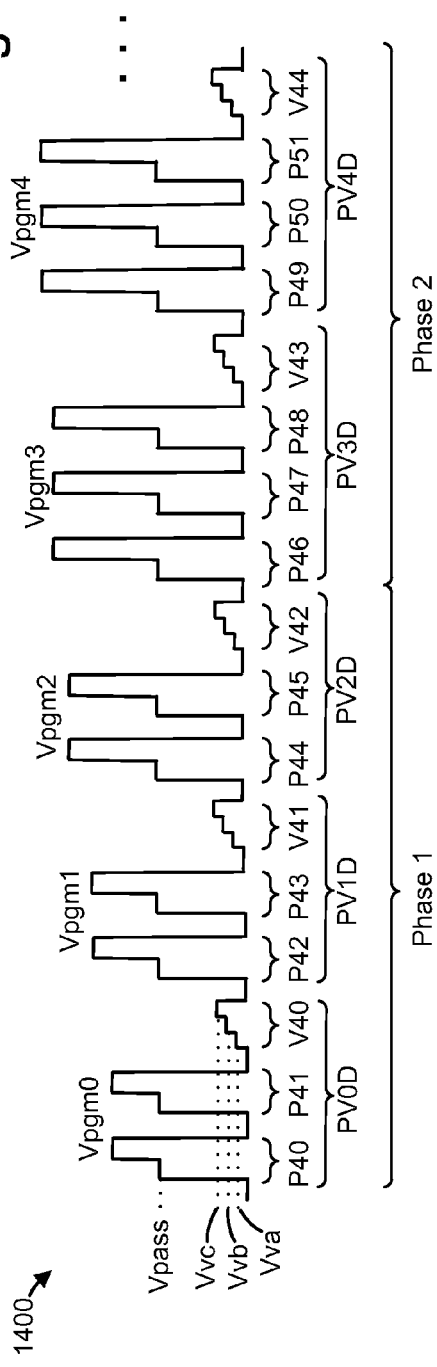
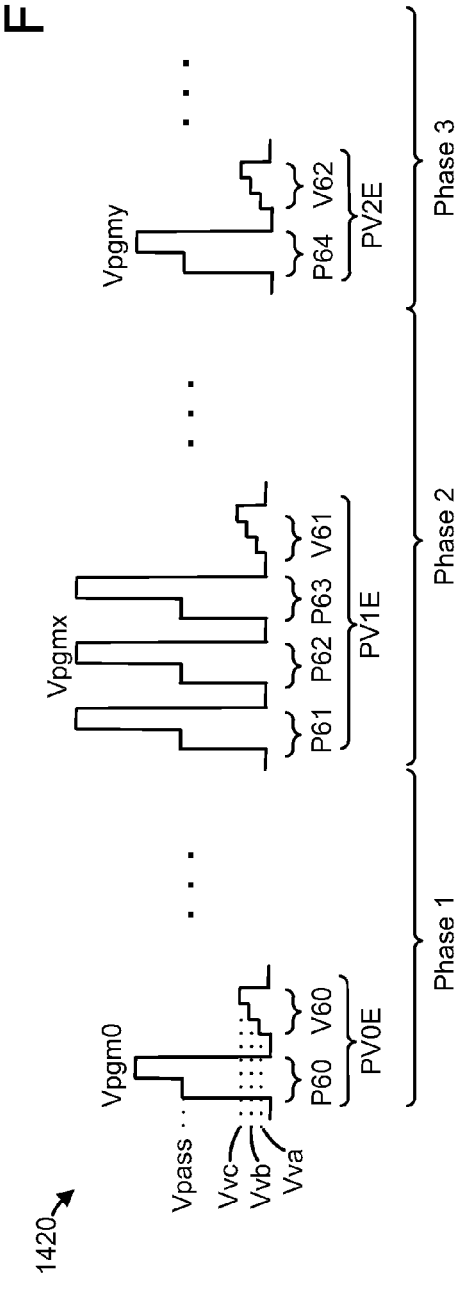

|  | Set M=1 | | Set M=2 | |
|---|---|---|---|---|
| Counter | 1 | 2 | 1 | 2 |
| Pulse K=1 | 0 | 1 | 1 | 0 |
| Pulse K=2 | 1 | 0 | 0 | 1 |

|  | Set M=1 | | | Set M=2 | | | Set M=3 | | |
|---|---|---|---|---|---|---|---|---|---|
| Counter | 1 | 2 | 3 | 1 | 2 | 3 | 1 | 2 | 3 |
| Pulse K=1 | 0 | 1 | 1 | 1 | 0 | 1 | 1 | 1 | 0 |
| Pulse K=2 | 1 | 0 | 1 | 1 | 1 | 0 | 0 | 1 | 1 |
| Pulse K=3 | 1 | 1 | 0 | 0 | 1 | 1 | 1 | 0 | 1 |

|  | Set M=1 | | | | Set M=2 | | | | Set M=3 | | | | Set M=4 | | | |
|---|---|---|---|---|---|---|---|---|---|---|---|---|---|---|---|---|
| Counter | 1 | 2 | 3 | 4 | 1 | 2 | 3 | 4 | 1 | 2 | 3 | 4 | 1 | 2 | 3 | 4 |
| Pulse K=1 | 0 | 1 | 1 | 1 | 1 | 0 | 1 | 1 | 1 | 1 | 0 | 1 | 1 | 1 | 1 | 0 |
| Pulse K=2 | 1 | 0 | 1 | 1 | 1 | 1 | 0 | 1 | 1 | 1 | 1 | 0 | 0 | 1 | 1 | 1 |
| Pulse K=3 | 1 | 1 | 0 | 1 | 1 | 1 | 1 | 0 | 0 | 1 | 1 | 1 | 1 | 0 | 1 | 1 |
| Pulse K=4 | 1 | 1 | 1 | 0 | 0 | 1 | 1 | 1 | 1 | 0 | 1 | 1 | 1 | 1 | 0 | 1 |

Fig. 15D

|  | Set M=1 | | | | | | Set M=2 | | | | | | ...Set M=K | | | | | | ...Set M=N-1 | | | | | | Set M=N | | | | | |
|---|---|---|---|---|---|---|---|---|---|---|---|---|---|---|---|---|---|---|---|---|---|---|---|---|---|---|---|---|---|---|
| Counter | 1 | 2 | ... | Ki | ... | N-1 | N | 1 | 2 | ... | Ki | ... | N-1 | N | 1 | 2 | ... | Ki | ... | N-1 | N | 1 | 2 | ... | Ki | ... | N-1 | N | 1 | 2 | ... | Ki | ... | N-1 | N |
| Pulse K=1 | 0 | 1 | ... | 1 | ... | 1 | 1 | 1 | 0 | ... | 1 | ... | 1 | 1 | 1 | 1 | ... | 1 | ... | 1 | 1 | 1 | 1 | ... | 1 | ... | 0 | 1 | 1 | 1 | ... | 1 | ... | 1 | 0 |
| Pulse K=2 | 1 | 0 | ... | 1 | ... | 1 | 1 | 1 | 1 | ... | 1 | ... | 1 | 1 | 1 | 1 | ... | 1 | ... | 1 | 1 | 1 | 1 | ... | 1 | ... | 1 | 0 | 0 | 1 | ... | 1 | ... | 1 | 1 |
| ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... |
| Pulse K=Ki | 1 | 1 | ... | 0 | ... | 1 | 1 | 1 | 1 | ... | 1 | ... | 1 | 1 | 1 | 1 | ... | 0 | ... | 1 | 1 | 1 | 1 | ... | 1 | ... | 1 | 1 | 1 | 1 | ... | 1 | ... | 1 | 1 |
| ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... | ... |
| Pulse K=N-1 | 1 | 1 | ... | 1 | ... | 0 | 1 | 1 | 1 | ... | 1 | ... | 1 | 0 | 1 | 1 | ... | 1 | ... | 1 | 1 | 1 | 1 | ... | 1 | ... | 1 | 1 | 1 | 1 | ... | 1 | ... | 1 | 1 |
| Pulse K=N | 1 | 1 | ... | 1 | ... | 1 | 0 | 0 | 1 | ... | 1 | ... | 1 | 1 | 1 | 1 | ... | 1 | ... | 1 | 1 | 1 | 0 | ... | 1 | ... | 1 | 1 | 1 | 1 | ... | 1 | ... | 0 | 1 |

CHANNEL BOOSTING USING SECONDARY NEIGHBOR CHANNEL COUPLING IN NON-VOLATILE MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or memory cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the storage element can be placed in one of four discrete charge bands corresponding to four distinct threshold voltage ranges.

Typically, a program voltage Vpgm applied to the control gate during a programming operation is applied as a series of pulses that increase in magnitude over time. The program voltage can be applied to a selected word line. In one possible approach, the magnitude of the pulses is increased with each successive pulse by a predetermined step size or increment, e.g., 0.2-0.4 V. Vpgm can be applied to the control gates of flash memory elements. In the periods between the program pulses, a verify operation is carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform a verify operation for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, program disturb in memory devices is becoming increasingly important as memory device dimensions are scaled down. Program disturb occurs when the threshold voltage of an inhibited storage element is raised to a next higher data state, or to a level at which the storage element cannot be accurately read.

BRIEF DESCRIPTION OF THE DRAWINGS

In the drawings, like-numbered elements correspond to one another.

FIG. 6 is a block diagram depicting one embodiment of a sense block.

FIG. 9A depicts a cross-sectional view in a NAND string direction of a storage element, showing control gate-to-floating gate coupling, and floating gate-to-channel coupling.

FIG. 9B depicts a channel voltage as a function of a pass voltage for a storage element using the programming technique of FIG. 8A.

FIG. 9C depicts a cross-sectional view of NAND strings, showing channel-to-channel coupling.

FIG. 12C depicts a channel voltage as a function of a pass voltage for a storage element, comparing the programming technique of FIGS. 11A and 11B (curve 1250) to the programming technique of FIGS. 12A and 12B (curve 1252).

FIG. 14A depicts a series of program-verify iterations of a programming operation, where two program pulses are used in one programming phase, and three program pulses are used in a subsequent programming phase.

FIG. 14B depicts a series of program-verify iterations of a programming operation, where one program pulse per programming portion is used in first and third programming phases, and three program pulses per programming portion are used in a second programming phase.

FIG. 15A depicts a cyclic programming pattern with N=2 storage elements per set.

FIG. 15B depicts a cyclic programming pattern with N=3 storage elements per set.

FIG. 15C depicts a cyclic programming pattern with N=4 storage elements per set.

FIG. 15D depicts a cyclic programming pattern for a general case of N storage elements per set.

DETAILED DESCRIPTION

A method and non-volatile storage system are provided in which program disturb is reduced.

During a programming operation, unselected storage elements which have previously completed programming to a target data state are inhibited or locked out from further programming by boosting associated substrate channel regions. This channel boosting reduces the occurrence of program disturb in the inhibited storage elements. For a given channel of an unselected storage element, the boosted channel level can be positively or negatively affected by capacitive coupling from the primary neighbor channels, e.g., adjacent NAND strings. Capacitive coupling from secondary neighbor channels on either side can also be significant, especially in a scaled device. A given boosted channel can be advantageously coupled to a higher level if the neighboring channels are also boosted. Conversely, a given boosted channel reaches a lower level when the neighboring channels are grounded, such as when the neighboring channels are associated with selected storage elements. A worst case scenario occurs when an inhibited channel is adjacent to grounded channels on either side. Programming techniques discussed herein select storage elements along a word line for programming according to a pattern which optimizes the arrangement of unselected storage elements and which accounts for at least one of the primary and the adjacent secondary neighbor channels. The programming technique avoids a worst case scenario in which a channel is boosted to an insufficient level which allows program disturb to occur.

In an example programming technique, a group of storage element along a word line is divided into adjacent sets, each having N≥3 storage elements. A multi-pulse programming portion of a program-verify iteration is performed where only one of the storage elements in each set is selected to be programmed according to a pattern. Also, each selected storage element has a different relative position within its set. For example, under the N=3 storage elements case, during a first programming pulse, first, second and third storage elements are selected in first, second and third sets, respectively. During a second programming pulse, second, third and first storage elements are selected in the first, second and third sets, respectively. During a third programming pulse, third, first and second storage elements are selected in the first, second and third sets, respectively. A verify operation then occurs. The programming technique results in unselected storage elements being optimally grouped to benefit from channel-to-channel capacitive coupling.

Figure 1A:
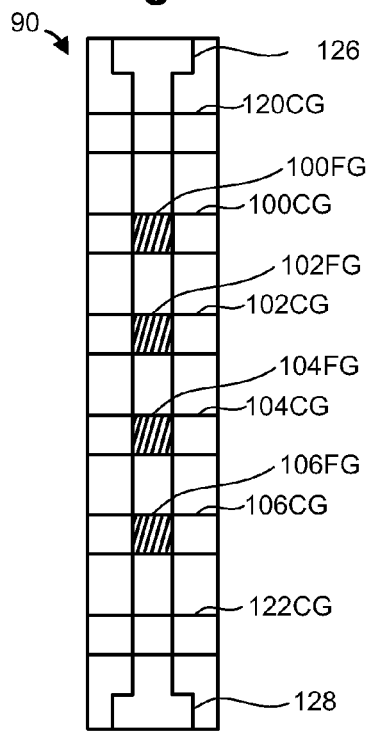
FIG. 1A is a top view of a NAND string.
Figure 1B:
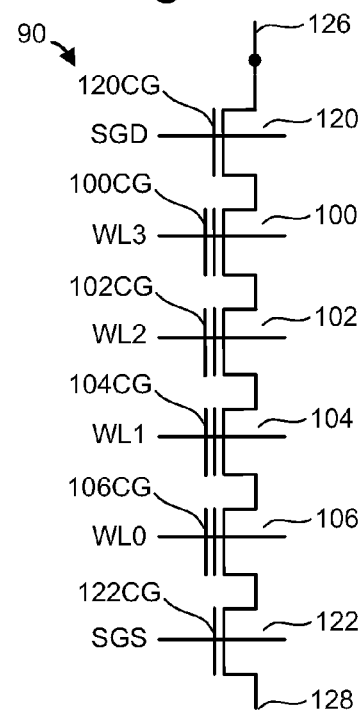
FIG. 1B is an equivalent circuit diagram of the NAND string.

One example of a suitable memory system in which the programming techniques can be implemented uses the NAND flash memory structure, which arranges multiple transistors in series between two select gates. The transistors in series and the select gates are referred to as a NAND string. FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each storage elements. In other embodiments, the storage elements may include multiple transistors or may be different than that depicted. Select gates 120 and 122 are connected to drain-side select line SGD and source-side select line SGS, respectively.

Figure 2:
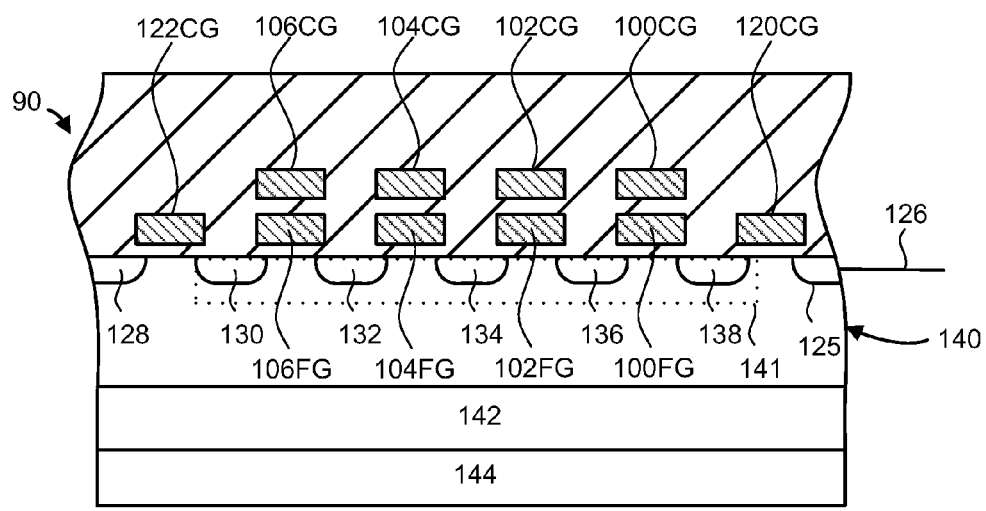
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the storage elements (100, 102, 104 and 106) form the word lines. N+ doped layers 130, 132, 134, 136 and 138 are shared between neighboring storage elements, whereby the storage elements are connected to one another in series to form a NAND string. These N+ doped layers form the source and drain of each storage element. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 125 connects to the bit line 126 for the NAND string, while N+ doped layer 128 connects to a common source line for multiple NAND strings. Some NAND strings will include 8, 16, 32, 64 or more storage elements. Each storage element can store data represented in analog or digital form, in one or more bits.

Other types of non-volatile memory in addition to NAND flash memory can also be used.

As part of a programming operation, the potential of a channel region of the substrate which is associated with an unselected storage element and, e.g., an unselected NAND string 90, can be boosted. An unselected storage element or NAND string may be referred to as an inhibited or locked out storage element or NAND string, respectively, as it is inhibited or locked out from programming in a given programming portion of a program-verify iteration of a programming operation. For example, channel region 141 may be provided in the p-well 140 of the substrate 144 when any of the storage elements which are provided by control gates and floating gates 100CG/100FG, 102CG/100FG, 104CG/104FG and 106CG/106FG is an unselected storage element in a programming operation, e.g., when the NAND string 90 is an unselected NAND string. The channel region 141 represents a conductive path in the substrate, extending in and between the doped regions 130, 132, 134, 136 and 138. Boosting can be achieved in different ways. For example, in a pre-charge operation, which occurs before a pass voltage is applied to an unselected word line, a voltage supplied on the bit line 126 can be passed to the channel 141 via the drain-side select gate transistor 120CG. In one possible scenario, with an appropriate bit line voltage, the drain-side select gate transistor provides a voltage of Vcg-Vth to the channel, where Vcg is the control gate voltage, and Vth is the threshold voltage, of the drain-side select gate transistor. The drain-side select gate transistor may subsequently be rendered non-conductive so that the bit line is cutoff from the channel 141, and the boosted potential is maintained in the channel. Channel boosting can also be achieved by applying pass voltages to the word line and maintaining the drain-side select gate transistor non-conductive. The pass voltages couple to the floating channel, raising its potential. Various channel boosting schemes are discussed in detail further below.

Figure 3:
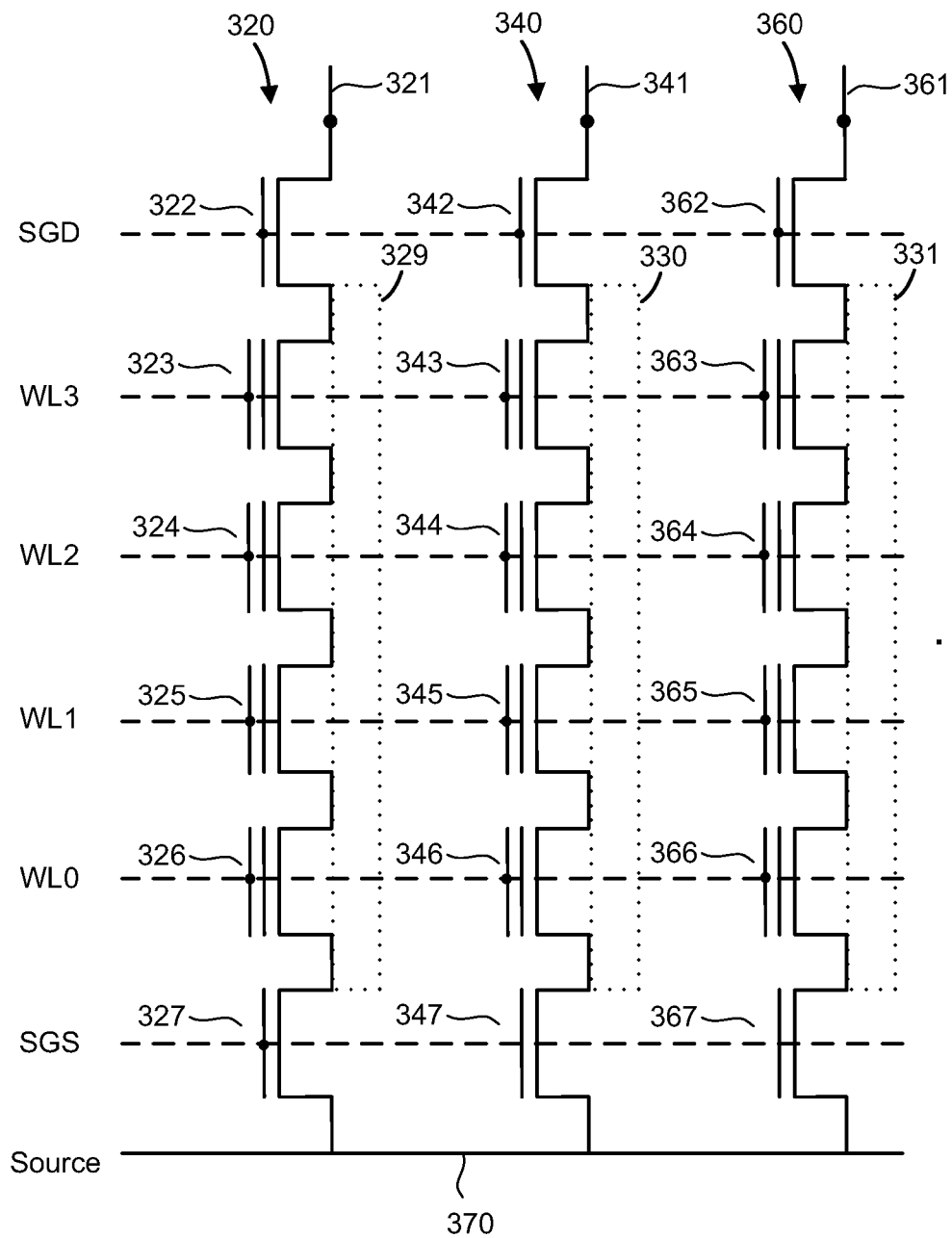
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line 370 by its select gates (e.g., select gates 327, 347 or 367). A selection line SGS is used to control the source side select gates. The various NAND strings 320, 340 and 360 are connected to respective bit lines 321, 341 and 361, by drain-side select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Example channel regions 329, 330 and 331 which are associated with the NAND strings 320, 340 and 360, respectively, may be created in the substrate. Note that the storage elements and channel regions are depicted as if they were rotated 90 degrees from their actual position.

Word lines are connected to the control gates for storage elements as follows: WL3 (storage elements 323, 343 and 363), WL2 (storage elements 324, 344 and 364), WL1 (storage elements 325, 345 and 365), and WL0 (storage elements 326, 346 and 366). Each word line connects the control gates of each storage element in the row. Or, the control gates may be provided by the portions of the word lines.

When programming a flash storage element, a program pulse is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised.

Figure 4:
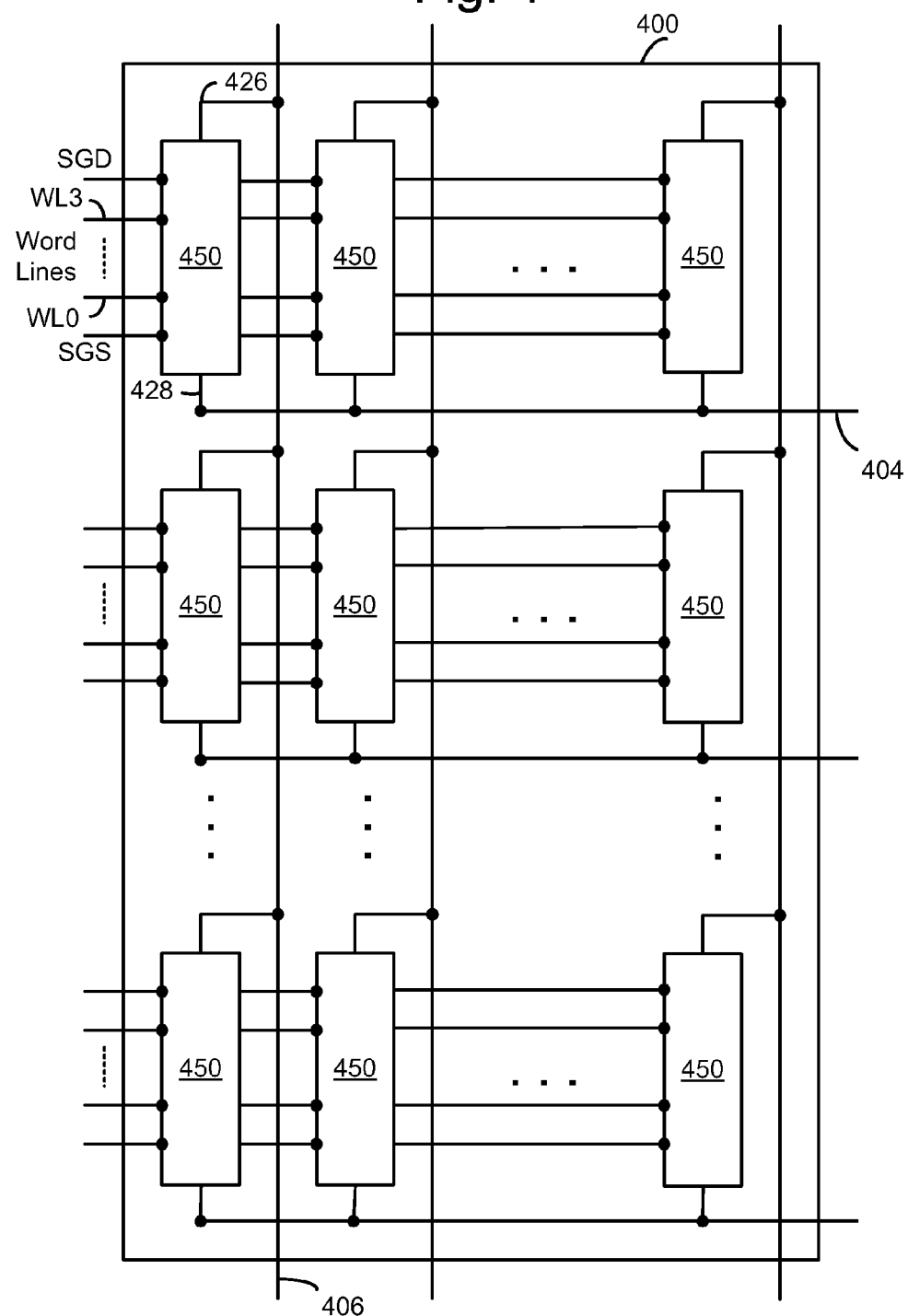
FIG. 4 is a block diagram of an array of NAND flash storage elements.

FIG. 4 illustrates an example of an array 400 of NAND storage elements, such as those shown in FIGS. 1A and 1B. Along each column, a bit line 406 is coupled to the drain terminal 426 of the drain-side select gate for the NAND string 450. Along each row of NAND strings, a source line (SL) 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. A large number of pages form a block, anywhere from 8 pages, for example, up to 32, 64, 128 or more pages. In some embodiments, a row of NAND strings comprises a block.

Figure 5:
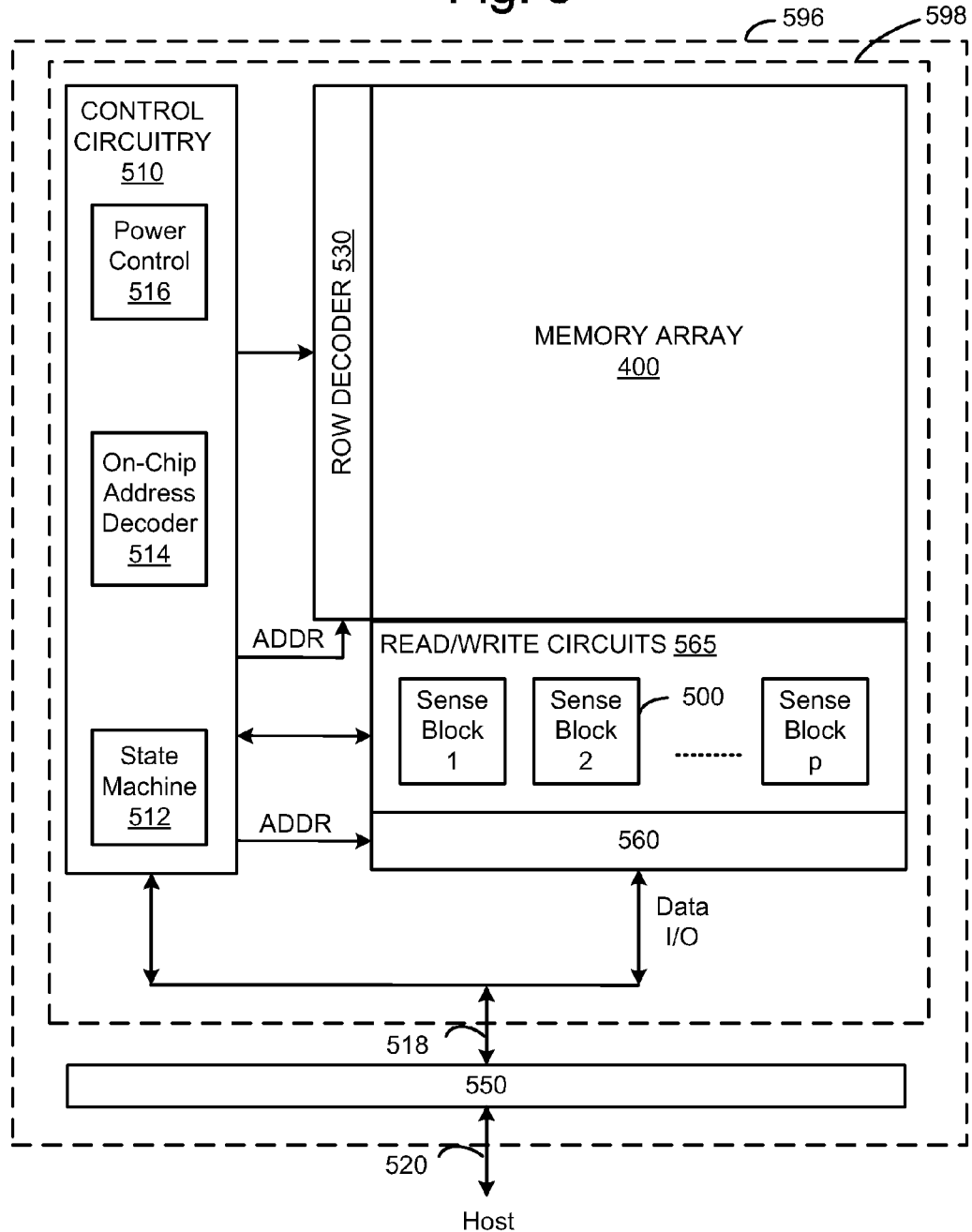
FIG. 5 is a block diagram of a non-volatile memory system using single row/column decoders and read/write circuits.

FIG. 5 is a block diagram of a non-volatile memory system using single row/column decoders and read/write circuits. A memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, and so forth.

In another embodiment, a non-volatile memory system uses dual row/column decoders and read/write circuits. Access to the memory array 400 by the various peripheral circuits is implemented in a symmetric fashion, on opposite sides of the array.

FIG. 6 is a block diagram depicting one embodiment of a sense block. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. See also FIG. 13. The set of data latches 594 is used to store data bits determined by processor 592 during a read operation. It is also used to store data bits imported from the data bus 520 during a programming operation. The imported data bits represent write data meant to be programmed into the memory. I/O interface 596 provides an interface between data latches 594 and the data bus 520.

During reading or other sensing, a state machine 512 controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a program portion of a program-verify iteration or the verify operation of a program-verify iteration, the data to be programmed is stored in the set of data latches 594 from the data bus 520. The programming operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
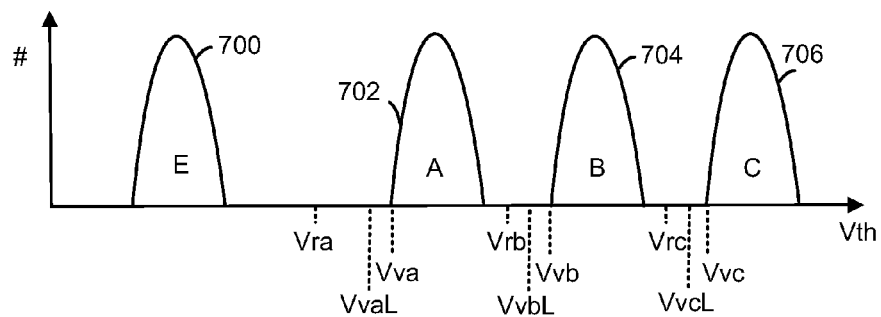
FIG. 7A depicts an example set of threshold voltage distributions.

FIG. 7A depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8A:
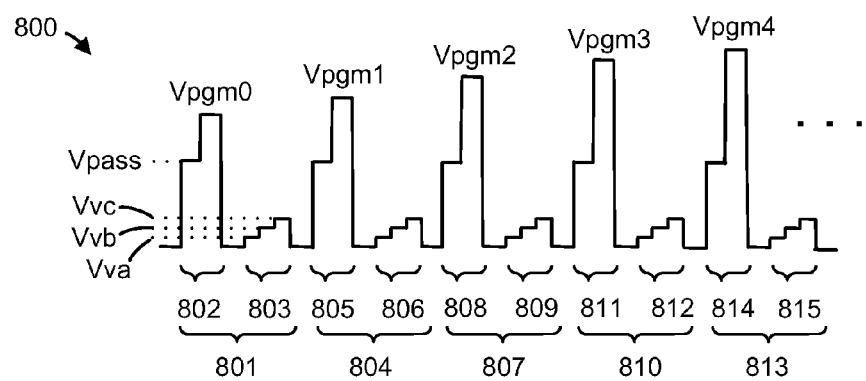
FIG. 8A depicts a series of program-verify iterations of a programming operation, where a single program pulse is used in the programming portion of each program-verify iteration.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8A will then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some case, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.5-1.0 V, which is between a nominal program or non-inhibit level, e.g., 0 V and a full inhibit level, e.g., 2.5 V. This provides greater accuracy by avoiding large step increases in threshold voltage. When the Vth reaches Vva, the storage element is locked out from further programming.

Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write (QPW) or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
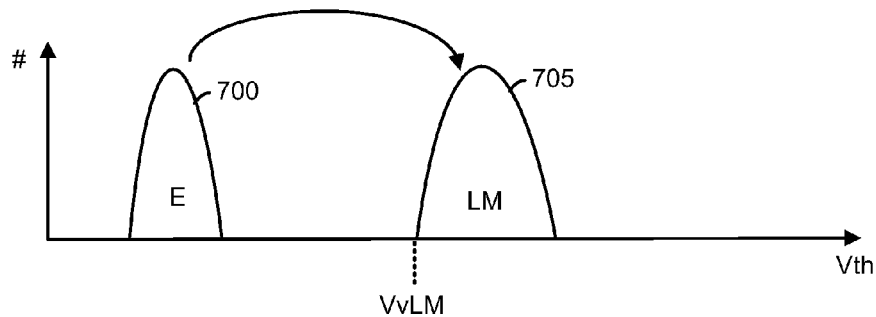
FIG. 7B illustrates a first pass of a two-pass programming technique.

FIG. 7B illustrates a first pass of a two-pass programming technique. In this example, a multi-state storage element that stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower middle) state (distribution 705).

Figure 8B:
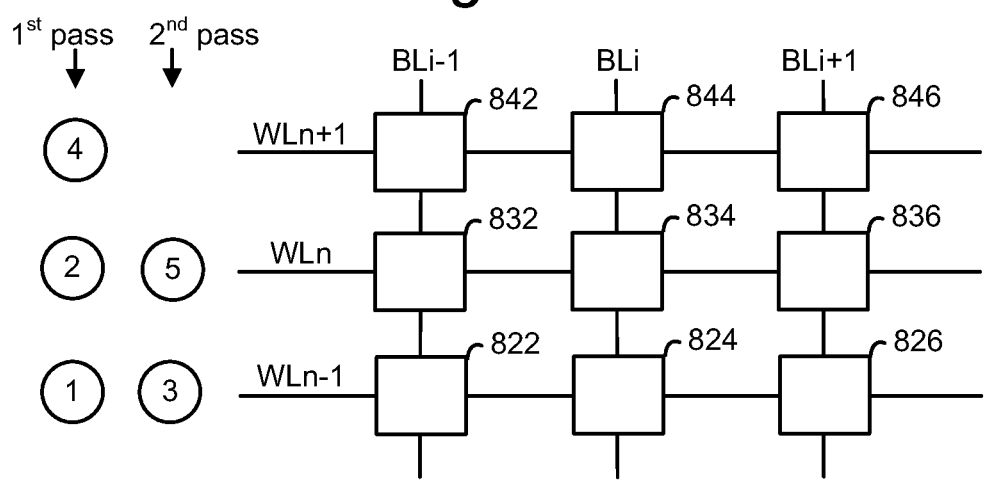
FIG. 8B depicts a multi-pass programming operation for a set of storage elements.

In one embodiment, after a storage element is programmed from the E-state to the LM-state, as indicated by step "1" in FIG. 8B, its neighbor storage element on an adjacent word line WLn+1 in the NAND string will then be programmed with respect to its lower page in a respective first programming pass of the adjacent word line, as indicated by step "2" in FIG. 8B.

Figure 7C:
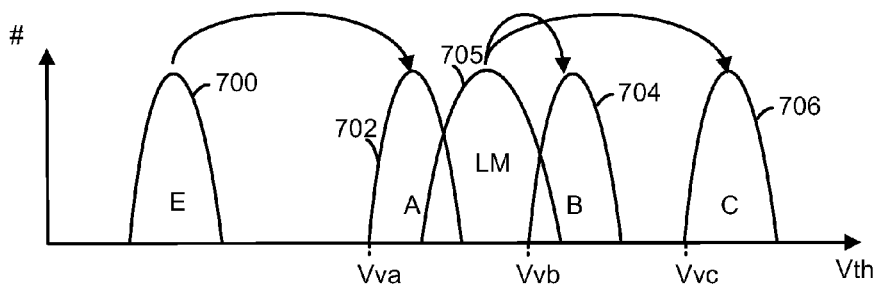
FIG. 7C illustrates a second pass of the two-pass programming technique of FIG. 7B.

FIG. 7C illustrates a second pass of the two-pass programming technique of FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 8B. The second pass of the two-pass programming technique for WLn+1 is indicated by step "5" in FIG. 8B.

Figure 7D:
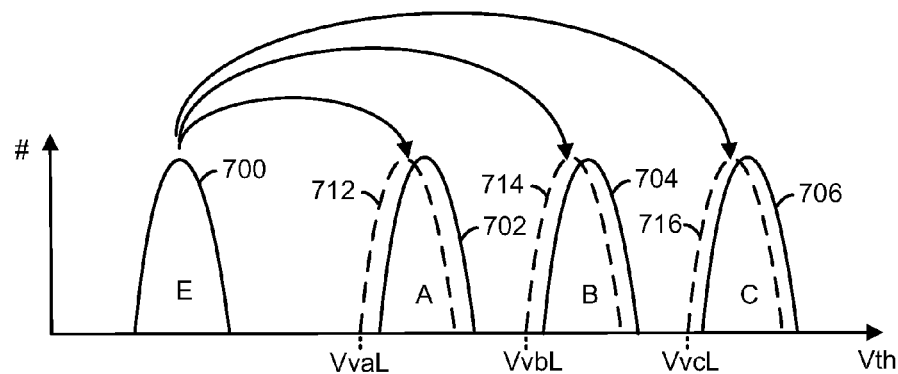
FIG. 7D illustrates a first pass of another two-pass programming technique.

FIG. 7D illustrates a first pass of another two-pass programming technique. In this example, referred to as foggy-fine programming, the A-state, B-state and C-state storage elements are programmed from the E-state to distributions 712, 714 and 716, respectively, using lower verify levels VvaL, VvbL and VvcL, respectively. This is the foggy programming pass. A relatively large program pulse step size may be used, for instance, to quickly program the storage elements to the respective lower verify levels.

Note that Vbl and the channel of a selected storage element are typically at 0 V to allow programming to occur. However, some programming techniques set Vbl and the channel of the selected storage element to a low level such as 0.5-1 V which allows programming to occur but at a slower rate. For example, when lower and higher/final verify levels are used, a storage element may be programmed to a respective lower target verify level at a relatively fast programming speed by setting Vbl=0 V, and after the Vth of the storage element has reached the respective lower target verify level, the storage element may be programmed to the respective final target verify level at a relatively slow programming speed by setting Vbl=0.5-1 V.

Figure 7E:
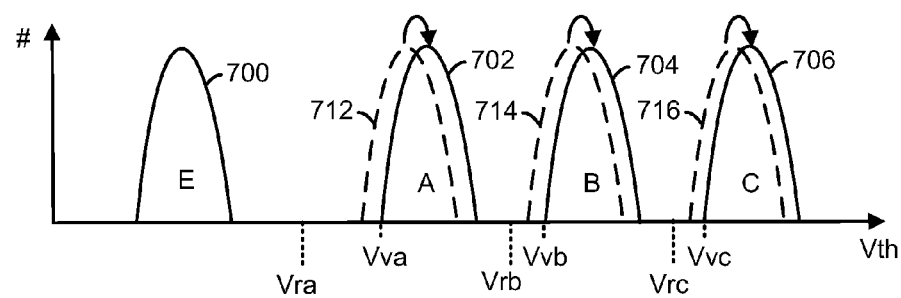
FIG. 7E illustrates a second pass of the two-pass programming technique of FIG. 7D.

FIG. 7E illustrates a second pass of the two-pass programming technique of FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program pulse step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to different programming techniques.

FIG. 8A depicts a series of program-verify iterations of a programming operation, where a single program pulse is used in the programming portion of each program-verify iteration. A programming operation may include multiple program-verify iterations, where each program-verify iteration includes a) a programming portion comprising one or more program pulses and b) a following verify operation. In this example, each programming portion comprises a single program pulse, followed by a verify operation which includes one or more verify voltages. Each programming portion therefore is a single-program pulse programming portion. Examples of programming portions which are multi-program pulse programming portions are discussed below. The program pulse and verify voltages can be applied to a selected word line, for instance.

In one possible approach, the program pulses are stepped up in successive iterations. Moreover, each program pulse may include a first portion which has a pass voltage (Vpass) level, e.g., 6-8 V, followed by a second, peak amplitude portion at a program level, e.g., 12-25 V. For example, the programming operation 800 includes first, second, third, fourth and fifth program-verify iterations 801, 842, 807, 810 and 813, respectively, which include programming portion waveforms 802, 805, 808, 811 and 814, respectively, having program levels of Vpgm0, Vpgm1, Vpgm2, Vpgm3 and Vpgm4, respectively, and verify operation waveforms 803, 806, 809, 812 and 815, respectively. In some cases, a programming portion is not followed by a verify operation because it is not expected that any storage elements have reached the lowest program state (e.g., A-state). Subsequently, a verify operation may use verify pulses for the A-state, followed by a verify operation which uses verify pulses for the A- and B-states, followed by a verify operation which uses verify pulses for the B- and C-states, for instance.

FIG. 8B depicts a multi-pass programming operation for a set of storage elements. The components depicted may be a subset of a much larger set of storage elements, word lines and bit lines. In one possible programming operation, storage elements on WLn−1, e.g., storage elements 822, 824 and 826, are programmed in a first programming pass. This step is represented by the circled "1." Next ("2"), storage elements on WLn, e.g., storage elements 832, 834 and 836, are programmed in a first programming pass. In this example, when a word line is selected for programming, a verify operation occurs after each program pulse. During the verify operation on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1, e.g., storage elements 842, 844 and 846, are programmed in a first programming pass. Next ("5"), the storage elements on WLn are programmed in a second programming pass to their respective target states.

The main reason to program the storage elements in such a back-and-forth word line order is to minimize the Vth shift on neighboring WL storage elements, after the selected WL storage elements have been programmed to its final pass. A higher Vth shift on neighboring storage elements results in higher interference effects on the selected WL storage elements, which widen their Vth distributions. Thus, reducing the Vth shift on neighboring WL storage elements reduces the interference effects seen by selected storage elements and hence minimizes the Vth distribution widening seen by them.

FIG. 9A depicts a cross-sectional view in a NAND string direction of a storage element, showing control gate-to-floating gate coupling, and floating gate-to-channel coupling. An example storage element 910 includes a control gate 912 at a voltage of Vpgm, a floating gate 914 at a voltage of Vfg and an associated channel 915 (e.g., at 0 V for programming or at Vch>0 V for inhibit). Vch is a channel voltage. As mentioned at the outset, the peak boosting level which can be reached in a channel region associated with an unselected storage element, e.g., in a channel region of an unselected NAND string, is affected by the neighboring channel regions. A higher boosting level can be reached when the neighboring channel regions are also boosted, e.g., when the neighboring channel regions are associated with unselected or inhibited storage elements/NAND strings. However, a lower boosting level which may result in program disturb is reached when the neighboring channel regions are grounded, e.g., when the neighboring channel regions are associated with selected storage elements/NAND strings.

Specifically, in a NAND memory, many storage elements are programmed in parallel on a given word line (WL). Each storage element is programmed toward a target verify level of a target state (such as the E-, A-, B- or C-state). Once a storage element reaches its target verify level, it is inhibited from further programming. Similarly, a storage element that is targeted for the E-state (erased-state) is inhibited right from the first program pulse. To inhibit a storage element from programming, its channel needs to be boosted to a significantly high potential such that the floating gate (FG)-to-channel field is reduced sufficiently to prevent a significant amount of Fowler-Nordheim (FN) tunneling. To program storage elements to higher Vth states, the Vpgm need to be higher, which also increase the susceptibility of inhibited storage elements to program disturb. The E-state is the most susceptible to program disturb since it has the highest Vfg. Generally, the higher the Vch which can be reached, the higher the Vpgm which can be used before experiencing program disturb on the E-state storage elements, and the higher the Vth verify level to which the storage elements can be programmed. This means the Vth window (defined as the gap between the highest state lower-tail and lowest state upper-tail) is wider if Vch is higher.

Moreover, as the voltage (Vpass) applied to unselected word lines increases, Vch increases due to control gate to floating gate to channel coupling. However, it has been observed that Vch is clamped at a maximum level when Vpass is sufficiently high, such that increasing Vpass further has substantially no effect on Vch. The cause for this clamping is suspected to be junction leakage under the source/drain junctions and band-to-band tunneling under the boosted channel. Moreover, a strong dependence on the primary neighbor channel state is seen for the clamped Vch value. If the neighbor channels are boosted (the neighbor storage element is inhibited from being programmed), channel-to-channel coupling helps to increase boosting on the selected channel, which increases the clamped Vch value. On the other hand, if the neighbor channels are grounded (the neighbor storage element is being programmed), the clamped Vch value is lowered significantly.

This phenomenon is depicted in FIG. 9B, which depicts a channel voltage as a function of a pass voltage for a storage element using the programming technique of FIG. 8A. Curve 984 depicts the case with both primary neighbor channels grounded. Curve 986 depicts the case with one primary neighbor channel grounded and the other primary neighbor channel boosted. Curve 980 depicts the case with both primary neighbor channels boosted. In practice, the program disturb on E-state storage elements when both primary neighbor channels are grounded is the worst case. Curve 984 indicates that Vch increases as Vpass increases before it is clamped at a low peak level, curve 982 indicates Vch increases at a higher level than curve 984 as Vpass increases before it is clamped at a higher peak level, and curve 980 indicates Vch increases at a higher level than curve 982 as Vpass increases and reaches a highest peak level of the three cases. In practice, the clamped value is what determines the tolerance to program disturb, and thus a higher clamped value is preferred. It is clear that Vch clamps at a higher value if one (curve 982) or both of the primary neighbors channels are boosted (curve 980).

FIG. 9C depicts a cross-sectional view of NAND strings, showing channel-to-channel coupling. A bit line or NAND string direction goes into the page, and a word line direction goes from left to right. A word line 900 extends across multiple NAND strings which include respective channel regions 916, 926, 936, 946 and 956. A storage element 910 in a first NAND string includes a control gate 912, a floating gate 914, and the channel region 916. A storage element 920 in a second NAND string includes a control gate 922, a floating gate 924, and the channel region 926. A storage element 930 in a third NAND string includes a control gate 932, a floating gate 934, and the channel region 936. A storage element 940 in a fourth NAND string includes a control gate 942, a floating gate 944, and the channel region 946. A storage element 950 in a fifth NAND string includes a control gate 952, a floating gate 954, and the channel region 956.

Due to the capacitances between the neighboring channels, the potential of the middle channel 936, for instance, is strongly modulated by its neighbor channels. Channels 926 and 946 are the first degree or primary neighbor channels, which are adjacent to channel 936 on either side of channel 936. Channels 916 and 956 are the second degree or secondary neighbor channels of channel 936 on either side of channel 936. Channels 916 and 956 are adjacent to channels 926 and 946, respectively.

As mentioned, if the primary neighbor channels of the middle channel 936 are boosted (programming is inhibited), this increases Vch on the middle channel. On the other hand, when the primary neighbor channels are grounded (programming is allowed), this reduces Vch on the middle channel significantly. This situation which should be avoided if possible. Moreover, as memory devices are scaled down, channel-to-channel separation becomes smaller so that channel-to-channel coupling increases. Thus, the neighbor channel coupling effect becomes increasingly strong, potentially reducing the clamped Vch.

One approach to improving channel boosting is pair bit line programming (shown in FIG. 11B), in which all bit lines/NAND strings are grouped into even and odd pairs of physically adjacent bit lines/NAND strings and programming is done in two steps for storage elements of a selected word line. In a first step, the storage elements associated with the even pairs of bit lines are programmed followed by a second step in which the storage elements associated with the odd pairs of bit lines are programmed. A verify operation is then performed for all the storage elements together, for instance. This process guarantees that, for each channel of an unselected storage element, at least one of the primary neighbor channels is boosted to increase Vch of the channel to help reduce the program disturb (e.g., E to A fails). An E to A fail occurs when an E-state storage element has its Vth increased by program disturb so that the storage element appears to be an A-state storage element when it is read.

For example, in FIG. 9C, consider storage element 930 as an example subject unselected storage element. Pair bit program guarantees that at least one of the primary neighbor channels is inhibited, (e.g., channel 926 in communication with BLn−1 or channel 946 in communication with BLn+1) but it offers no control over the state of the secondary neighbor channels (e.g., channel 916 in communication with BLn−2 and channel 956 in communication with BLn+2). However, due to continued scaling of memory devices, even the secondary neighbor channel's state can affect the Vch of a subject storage element. For example, if the secondary neighbor channel (916, 956) is grounded, it will couple to the primary neighbor channels (926, 946) to lower their potential, and the lowering of the potential in the primary neighbor channels (926, 946) will in turn couple to Vch of the subject channel 936. Thus, the clamped Vch value on BLn is lowered by coupling from BLn−2 to BLn−1 to BLn, and from BLn+2 to BLn+1 to BLn. On the other hand, with programming techniques as described herein, at least one of the primary and the adjoining secondary neighbor channel is guaranteed to be in a boosted state, resulting in beneficial coupling back to the channel of BLn.

Note that the secondary neighbor channel coupling affects the Vch of the subject channel only if the adjoining primary neighbor channel is inhibited (not grounded). That is, the secondary neighbor channel coupling does not substantially affect the Vch of the subject channel if the adjoining primary neighbor channel is grounded. For example, if BLn+1 is grounded, then the BLn+2 channel potential will not affect Vch on BLn. The BLn+2 channel will affect BLn Vch only if BLn+1 is boosted. This is because if the BLn+1 channel is grounded, then its potential is clamped at 0 V, and hence it is not going to be affected by the BLn+2 channel potential, which in turn means BLn Vch will remain unaffected as well. In contrast, a boosted channel has a floating potential and is therefore subject to having its potential changed by capacitive coupling.

Programming techniques provided herein account for the states of the primary neighbor channels as well as the secondary neighbor channels to improve Vch clamping of a subject channel. The techniques can be extended to account for tertiary and higher order neighbor channels. Specific programming techniques are discussed in the context of the example array of storage elements of FIG. 10.

Figure 10:
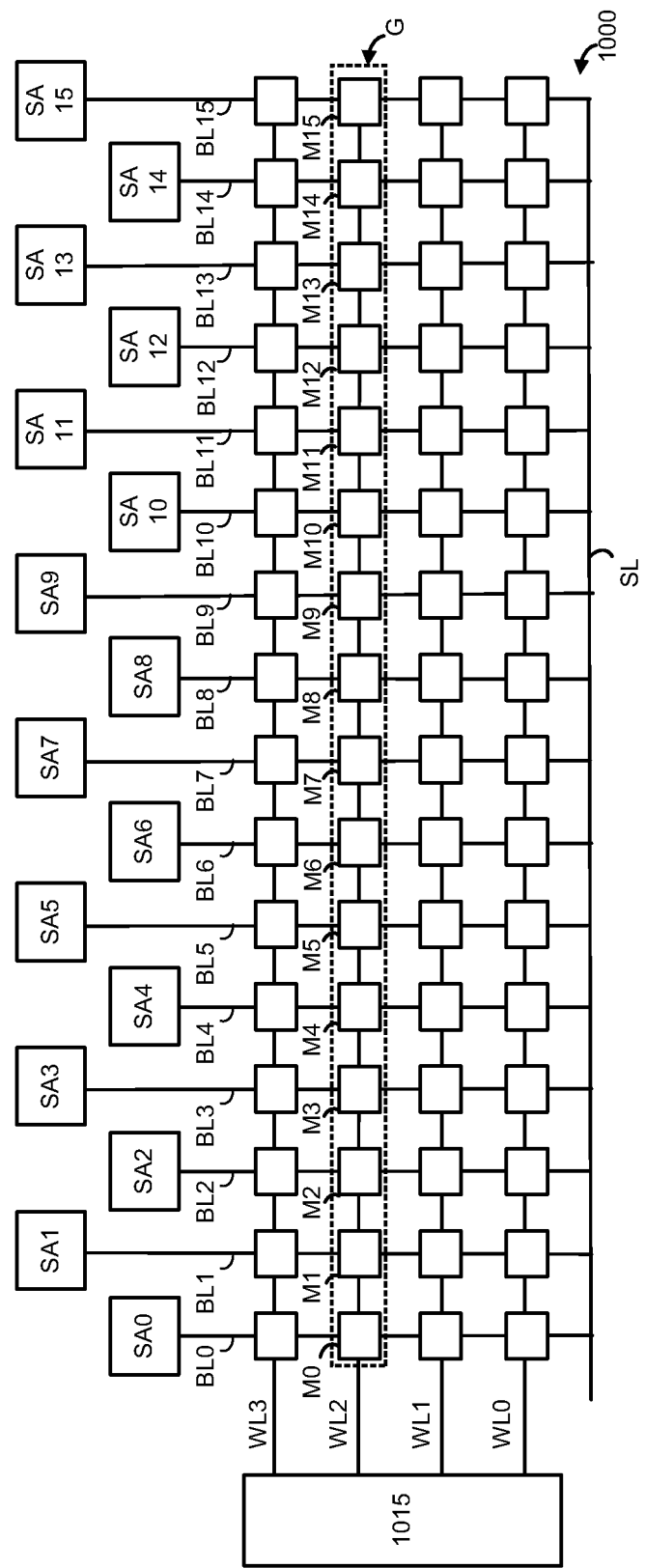
FIG. 10 depicts an array of storage elements, including a group G with storage elements M0-M15.

FIG. 10 depicts an array 1000 of storage elements, including a group G with storage elements M0-M15. An example programming technique is all bit line programming which involves concurrently storing a page of data in a group of adjacent storage elements in communication with a common word line. A page is the smallest unit of data which is written as a unit by a host device. A block of storage elements can include a number of rows of storage elements which are arranged along associated word lines, such as word lines WL0, WL1, WL2 and WL3. A word line voltage source 1015 provides voltages to the word lines during programming and read operations. Typically, one word line is a selected word line which includes a group of storage elements that have been selected for programming or reading. The storage elements are associated with bit lines BL0-BL15, in this example. The storage elements may be arranged in NAND strings, where each NAND string is associated with a respective one of the bit lines. Further, a sense amplifier is associated with each bit line for sensing whether a selected storage element is conductive, e.g., in a verify operation. For example, sense amplifiers SA0-SA15 are associated with BL0-BL15, respectively. A controller within the memory device accesses the sense amplifier to determine whether a selected storage element is conductive and stores corresponding data in a buffer (data latch) which indicates the state of a storage element. A common source line SL for the NAND strings is also provided. Note that the NAND array also comprises of one select gate at each of the source and drain end of the array. They are not shown for simplicity.

Consider WL2 as an example selected word line in a programming operation. In practice, the array may be programmed starting from WL0 and proceeding to WL3. A group G of storage elements includes storage elements (memory cells) M0-M15 which are arranged along the word line and are associated with BL0-BL15, respectively. Each of the storage elements has a respective channel region which is in communication with BL0-BL15, respectively. Recall that FIG. 3 depicted example channel regions 329, 330 and 331 which are associated with the NAND strings 320, 340 and 360, respectively. The channel runs along the length of the NAND string in the substrate.

A group of storage elements could include all, or fewer than all of the storage elements associated with WL2. Further, the storage elements along WL2 can be considered to be arranged in adjacent sets such as described in FIGS. 11B, 12B and 13B. The array could be larger than what is depicted, including more word lines and/or storage elements per word line. The array could also be smaller than what is depicted.

Figure 11A:
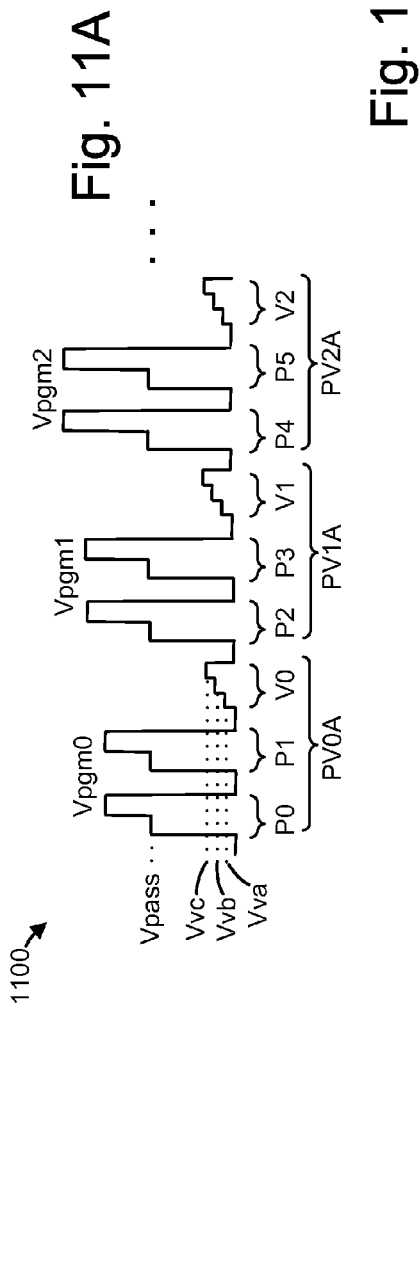
FIG. 11A depicts a series of program-verify iterations of a programming operation, where two program pulses are used in each program-verify iteration.

FIG. 11A depicts a series of program-verify iterations of a programming operation, where two program pulses are used in each program-verify iteration. The programming operation 1100 includes program-verify iterations PV0A, PV1A, PV2A, . . . . Each program-verify iteration includes two program pulses and a verify waveform. For example, PV0A includes program pulses P0 and P1 and a verify waveform V0, PV1A includes program pulses P2 and P3 and a verify waveform V1, PV2A includes program pulses P4 and P5 and a verify waveform V2, and so forth.

Figure 11B:
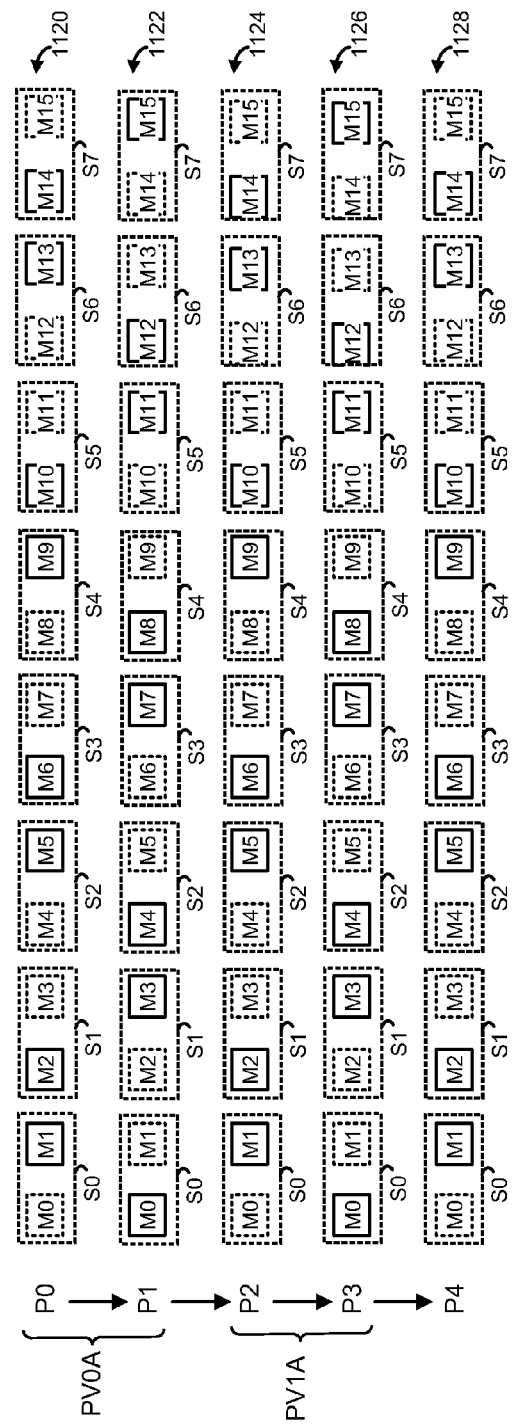
FIG. 11B depicts a sequence in which storage elements in sets S0-S7 are selected, where each set has N=2 storage elements, in correspondence with the programming operation of FIG. 11A.

FIG. 11B depicts a sequence in which storage elements in sets S0-S7 are selected, where each set has N=2 storage elements, in correspondence with the programming operation of FIG. 11A. N is a natural number (positive integer). The first row 1120 depicts which storage elements are selected (dashed lines) and which are unselected (solid lines) during P0. The following rows 1122, 1124, 1126 and 1128 also identify the selected and unselected storage elements during P1, P2, P3 and P4, respectively. Further, the storage elements are arranged in sets S0-S7. The rows depict the selected and unselected storage elements in a time sequence, from the top row to the bottom row as time increases. For example, referring to S0, at rows 1120, 1124 and 1128, M0 is selected and M1 is unselected. At rows 1122 and 1126, M0 is unselected and M1 is selected. The selected and unselected storage elements in S1 are a mirror image of S0. The selected and unselected storage elements in S0, S2, S4 and S6 follow the same pattern, and the selected and unselected storage elements in S1, S3, S5 and S7 follow the same pattern. Note that, here, "unselecting" a storage element refers to inhibiting it from programming, irrespective of whether it has reached its target verify level or not. On the other hand, "selecting" a storage element refers to allowing it to program towards its target verify level, if it has not reached its target verify level yet. However, if the specific storage element has already reached its target verify level, then it would be inhibited anyway. As mentioned earlier, programming or inhibiting a storage element is achieved by raising the associated bit line voltage to a low level, e.g., 0 V for nominal program, and a high level, e.g., 2.5 V for inhibit.

In this case, each unselected storage element will have one primary neighbor storage element which is selected, and the other primary neighbor storage element which is unselected. For example, in row 1120, M1 (unselected) has M0 (selected) and M2 (unselected). Thus, it is guaranteed that the channel of each unselected storage element has at least one of the primary neighbor channels that will be boosted. This is referred to as the pair bit line programming, since the storage elements can be viewed as being divided into pairs of even and odd storage elements, where the pairs are alternatively selected and unselected during each program-verify iteration.

With "1" denoting an inhibit (or unselected bit line) status and "0" denoting a program (or selected bit line) status, this program sequence can be depicted by the following pattern which repeats along a word line: first program pulse: [0 1, 1 0], and second program pulse: [1 0, 0 1].

Figure 12A:
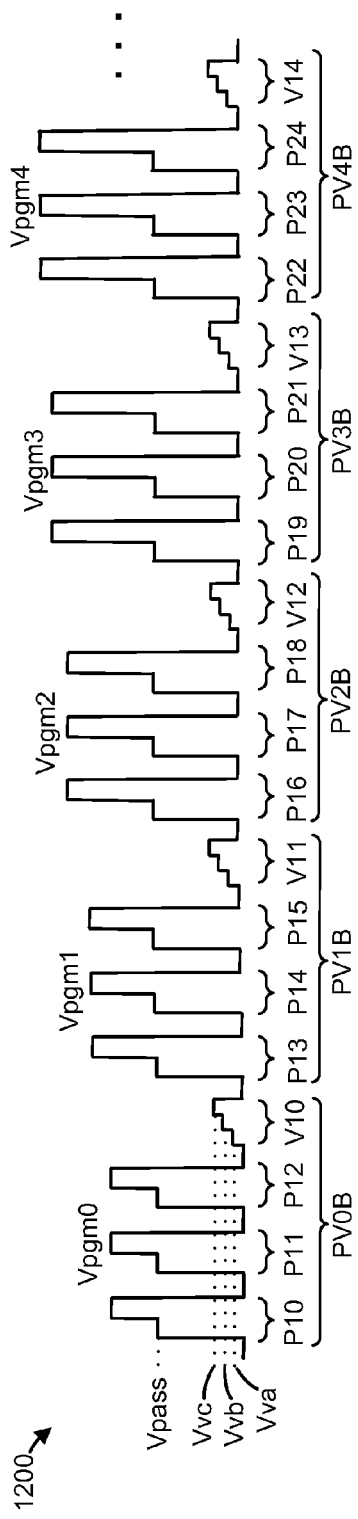
FIG. 12A depicts a series of program-verify iterations of a programming operation, where three program pulses are used in each program-verify iteration.

FIG. 12A depicts a series of program-verify iterations of a programming operation, where three program pulses are used in each program-verify iteration. The programming operation 1200 includes program-verify iterations PV0B, PV1B, PV2B, PV3B, PV4B, . . . . Each program-verify iteration includes three program pulses in a programming portion and a verify waveform in a verify operation. For example, PV0B includes program pulses P10-P12 and a verify waveform V10, PV includes program pulses P13-P15 and a verify waveform V11, PV2B includes program pulses P16-P18 and a verify waveform V12, PV3B includes program pulses P19-P21 and a verify waveform V13, PV4B includes program pulses P22-P24 and a verify waveform V14. For each programming portion, the N successive programming pulses have a common amplitude. The common amplitude is stepped up in successive program-verify iterations.

Figure 12B:
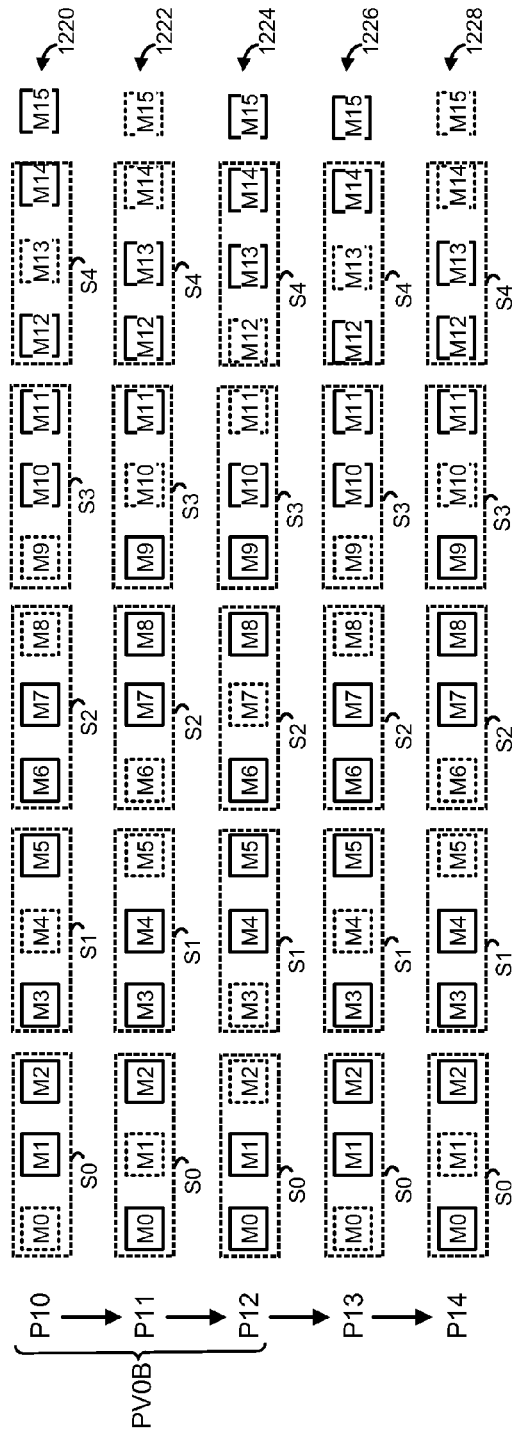
FIG. 12B depicts a sequence in which storage elements in sets S0-S4 are selected, where each set has N=3 storage elements, in correspondence with the programming operation of FIG. 12A.

FIG. 12B depicts a sequence in which storage elements in sets S0-S4 are selected, where each set has N=3 storage elements, in correspondence with the programming operation of FIG. 12A. The first row 1220 depicts which storage elements are selected (dashed lines) and which are unselected (solid lines) during P10. The following rows, rows 1222, 1224, 1226 and 1228, also identify the selected and unselected storage elements during P11, P12, P13 and P14, respectively. Further, the storage elements are arranged in sets S0-S4. Referring to S0, at row 1220, M0 is selected and M1 and M2 are unselected. At row 1222, M1 is selected and M0 and M2 are unselected. At row 1224, M2 is selected and M0 and M1 are unselected. The cycle then repeats at row 1226, where M0 is selected and M1 and M2 are unselected. At row 1228, M1 is selected and M0 and M2 are unselected.

In this approach, each unselected storage element is guaranteed to have: (a) on one side of the storage element, one primary neighbor storage element which is unselected and the adjoining secondary neighbor storage element which is unselected or (b) on both sides of the storage element, primary neighbor storage elements which are unselected. The storage elements are arranged side by side along a word line so that one side refers to a left side and the other side refers to the right side, for instance. Generally, a goal is to group unselected storage elements to the extent possible to allow channel-to-channel capacitive coupling to occur.

For example, for S0, in row 1220, M1 (unselected) has M2 (unselected) as the primary neighbor storage element on the right side and M3 (unselected) as the adjoining secondary neighbor storage element on the right side (case (a)). Also, M2 (unselected) has M1 (unselected) as the primary neighbor storage element on the left side and M3 (unselected) as the primary neighbor storage element on the right side (case (b)).

In this approach, each programming portion has three program pulses and is followed by a verify operation for all bit lines. The storage elements on a word line are grouped into triplets or sets of three adjacent storage elements. Further, the sets are adjacent to one another along a word line. Analogously, the bit lines are grouped into sets of three adjacent bit lines and the sets of bit lines are adjacent to one another.

With "1" denoting an inhibit status and "0" denoting a program status, this program sequence can be depicted by the following pattern which repeats along a word line: first program pulse: [0 1 1, 1 0 1, 1 1 0], second program pulse: [1 0 1, 1 1 0, 0 1 1] and third program pulse: [1 1 0, 0 1 1, 1 0 1].

During each program pulse, only one of the three storage elements in each set is selected for programming while the other two storage elements in the set are unselected. During the next program pulse, a next storage element in each set becomes the selected storage element, according to a cyclic or rotational pattern. The next storage element can be identified by moving by one or more storage elements to the right or left of the current storage element, for instance.

Figure 12D:
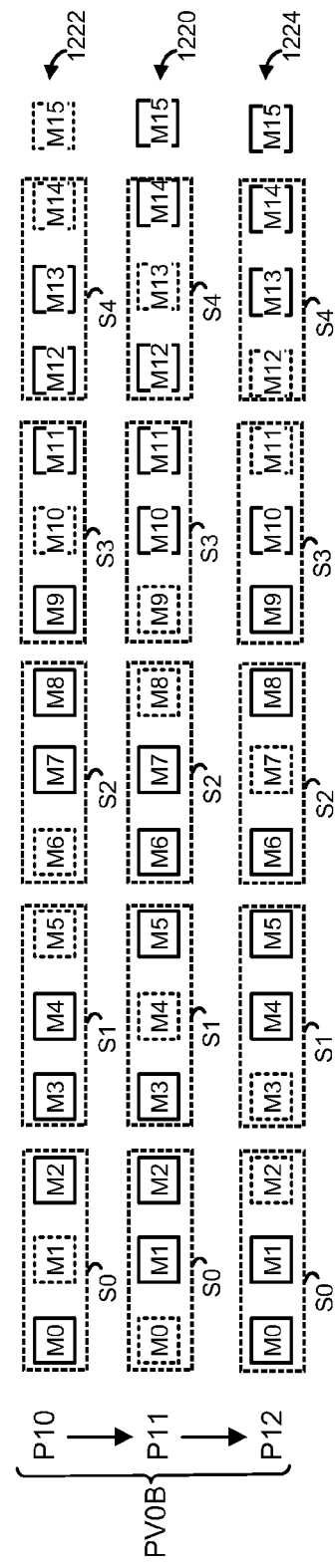
FIG. 12D depicts an alternative to the sequence of FIG. 12B in which the order of rows 1222 and 1224 is reversed.

For example, an alternative to the sequence of FIG. 12B is to swap rows 1222 and 1224 as depicted in FIG. 12D. FIG. 12D depicts an alternative to the sequence of FIG. 12B in which the order of rows 1222 and 1224 is reversed. In this case, M1 is selected with P10, then M0 is selected with P11 and then M2 is selected with P12. This progression is considered to follow a predetermined cyclic pattern or index since the storage elements are selected in a cycle, starting from one of the storage elements and selecting others one at a time until a last storage element in the set is selected. The transition from row 1220 to row 1224 is an example of a transition in which the next selected storage element (M2 in S0 in row 1224) is identified by moving two storage elements to the right of the current storage element (M0 in row 1220), for instance, or, equivalently, moving one storage element to the left.

In another approach, the configuration of the sets for each program pulses is decided by a random function, with the condition that each storage element is only selected once in a programming portion. For example, in a first step, the random function is used to choose one of the configurations of rows 1220, 1222 and 1224. In a second step, the random function is used to choose one of the configurations of the two remaining rows which were not chosen in the first step. In a third step, the configuration of the last remaining row is chosen by default. This progression is considered to follow a random cyclic pattern or index. In this approach, the configuration of each set S0, S1 and S2 is changed together.

By the time the last program pulse in a programming portion is applied, each storage element in each set has one and only one chance to be selected. As mentioned earlier, a storage element whose turn it is to be selected is not programmed if it has completed programming, e.g., it has reached a target Vth level and is locked out from being programmed in the remainder of the programming operation. In this case, no storage elements may be programmed in a set for the duration of a program pulse.

In a multi-pass programming operation, each pass can be considered to be a programming operation.

Under any programming scheme, the worst case boosting pattern in which the clamped level of Vch is lowest will be the limiting case for program disturb. The worst case boosting pattern under the two program pulse technique of FIGS. 11A and 11B and under the three program pulse technique of FIGS. 12A and 12B are compared in FIG. 12C.

Note that the approach of FIG. 12B can be contrasted with an approach in which the first, second or third storage element in each set is selected when the first, second or third program pulse, respectively, is applied. That is, the selected storage elements have the same relative position in each set. However, this approach does not guarantee the state of the secondary neighbor storage element. Although this approach ensures that at least one of the primary neighbor storage elements will be boosted, the same thing is not ensured for the adjoining secondary neighbor storage element. Thus, this approach would result in boosting that is lower than in the present example, on average, where an unselected storage element has at least one primary neighbor storage element and the adjoining secondary neighbor storage element which is boosted, or else, has both primary neighbors boosted.

FIG. 12C depicts a channel voltage as a function of a pass voltage for a storage element, comparing the programming technique of FIGS. 11A and 11B (curve 1250) to the programming technique of FIGS. 12A and 12B (curve 1252), both under their respective worst case boosting pattern. The worst case boosting pattern under the two program pulse technique is: 0-1-1-0 (one of the primary neighbors=boosted, adjoining secondary neighbor=grounded). The worst case boosting pattern under the three pulse programming technique is: 0-1-1-1 (one of the primary neighbors=boosted, adjoining secondary neighbor=boosted).

In both cases, if we consider that BLn is the bit line for a subject unselected storage element, one of the primary neighbor channels (e.g., the channel in communication with BLn+1) is inhibited. The only difference in both patterns is the state of the secondary neighbor channel (e.g., the channel in communication with BLn+2). Clearly, the maximum Vchannel is improved under the three program pulse technique due to the impact of the secondary channel coupling effect, which should expand the Vth window as described earlier. Also, note that Vch at any given Vpass increases under the three program pulse technique. This will result in fewer E to A fails (the most probable program disturb scenario) at any given Vpass and make the Vpass window wider (primarily on the lower-Vpass-side), which is an additional benefit.

For each of the three program pulses of a program-verify iteration, the bit lines are at first discharged down to ground, before charging them back up for next program pulse. In other words, channel boosting is repeated for each program pulse.

Also, for a particular BL indicated as a "program" or "0," if the storage element at that BL has not yet reached its target state, then it will be programmed. However, if that storage element has already reached its target state, it will be inhibited as usual. Thus every "0" or "program" in the sequence doesn't necessarily mean that the storage element will actually be programmed.

The concept of a program-verify iteration having three or more program pulses can be extended to include four or more program pulses. There is a tradeoff between having many neighbor storage elements which are inhibited and increased programming time which results from using additional program pulses in a program-verify iteration.

Figure 13A:
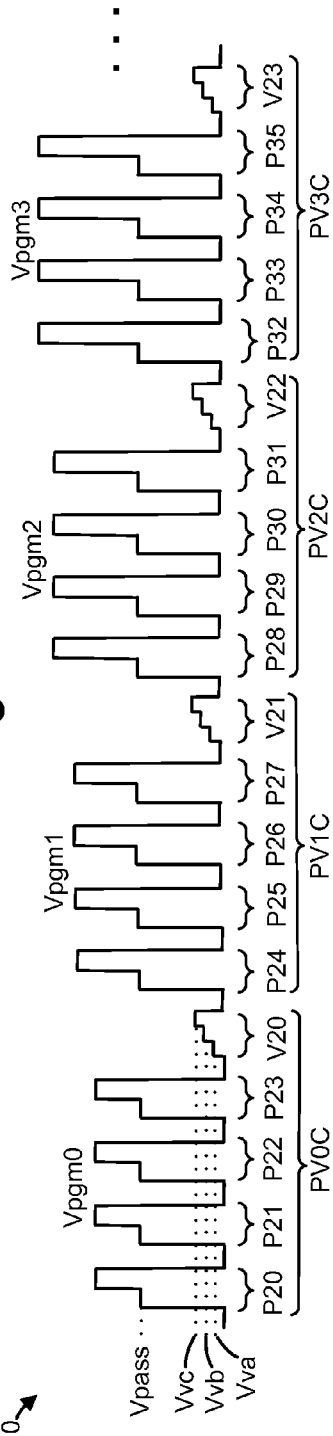
FIG. 13A depicts a series of program-verify iterations of a programming operation, where four program pulses are used in each program-verify iteration.

FIG. 13A depicts a series of program-verify iterations of a programming operation, where four program pulses are used in each program-verify iteration. The programming operation 1300 includes program-verify iterations PV0C, PV1C, PV2C, PV3C, . . . . Each program-verify iteration includes four program pulses and a verify waveform. For example, PV0C includes program pulses P20-P23 and a verify waveform V20, PV includes program pulses P24-P27 and a verify waveform V21, PV2C includes program pulses P28-P31 and a verify waveform V22, and PV3C includes program pulses P32-P35 and a verify waveform V23.

Figure 13B:
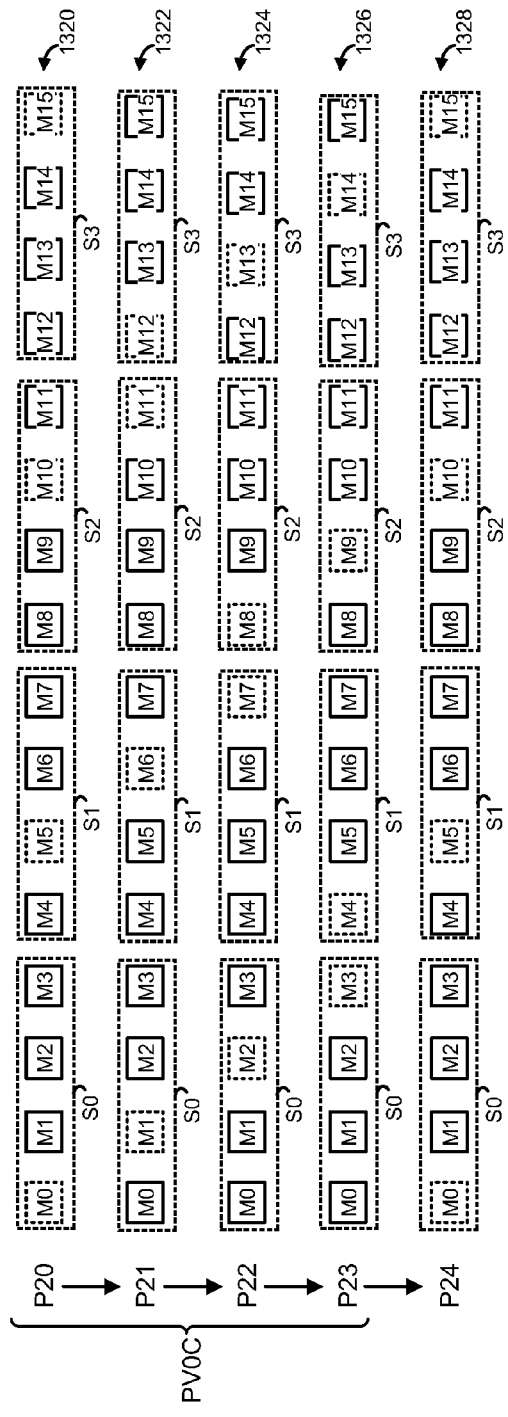
FIG. 13B depicts a sequence in which storage elements in sets S0-S3 are selected, where each set has N=4 storage elements, in correspondence with the programming operation of FIG. 13A.

FIG. 13B depicts a sequence in which storage elements in sets S0-S3 are selected, where each set has N=4 storage elements, in correspondence with the programming operation of FIG. 13A. The first row 1320 depicts which storage elements are selected (dashed lines) and which are unselected (solid lines) during P20. The following rows 1322, 1324, 1326 and 1328 also identify the selected and unselected storage elements during P21, P22, P23 and P24, respectively. Further, the storage elements are arranged in sets S0-S3. Time proceeds from the top row to the bottom row of the figure. For example, referring to S0, at row 1320, M0 is selected and M1, M2 and M3 are unselected. At row 1322, M1 is selected and M0, M2 and M3 are unselected. At row 1324, M2 is selected and M0, M1 and M3 are unselected. At row 1326, M3 is selected and M0, M1 and M2 are unselected. The cycle then repeats at row 1328, where M0 is selected and M1, M2 and M3 are unselected.

In the approach of FIG. 13B, each unselected storage element is guaranteed to have: (a) on one side of the storage element, one primary neighbor storage element which is unselected, the adjoining secondary neighbor storage element and the adjoining tertiary neighbor storage element which is unselected or (b) on both sides of the storage element, primary neighbor storage elements which are unselected, and, on one side, the adjoining secondary neighbor storage element which is unselected.

For example, for S0, in row 1320, M1 (unselected) has M2 (unselected) as the primary neighbor storage element on the right side, M3 (unselected) as the adjoining secondary neighbor storage element on the right side, and M4 (unselected) as the adjoining tertiary neighbor storage element on the right side (case (a)). Also, M2 (unselected) has M1 (unselected) as the primary neighbor storage element on the left side, M3 (unselected) as the primary neighbor storage element on the right side, and M4 (unselected) as the secondary neighbor storage element on the right side (case (b)).

In this approach, each programming portion has four program pulses followed by a verify operation for all bit lines. The storage elements on a word line are grouped into sets of four adjacent storage elements. Analogously, the bit lines are grouped into quadruplets or sets of four adjacent bit lines.

With "1" denoting an inhibit status and "0" denoting a program status, this program sequence can be depicted by the following pattern which repeats along a word line: first program pulse: [0 1 1 1, 1 0 1 1, 1 1 0 1, 1 1 1 0], second program pulse: [1 0 1 1, 1 1 0 1, 1 1 1 0, 0 1 1 1], third program pulse: [1 1 0 1, 1 1 1 0, 0 1 1 1, 1 0 1 1] and fourth program pulse: [1 1 1 0, 0 1 1 1, 1 0 1 1, 1 1 0 1]. See also FIGS. 15A-15D.

During each program pulse, only one of the four storage elements in each set is selected for programming while the other three storage elements in the set are unselected. During the next, program pulse, a next storage element in each set becomes the selected storage element, according to a cyclic or rotational pattern. The technique could be extended to five or more program pulses per program-verify iteration. See FIG. 15D for a general case.

FIG. 14A depicts a series of program-verify iterations of a programming operation, where two program pulses are used in one programming phase, and three program pulses are used in a subsequent programming phase.

The programming operation 1400 includes a first phase (Phase 1) which includes program-verify iterations PV0D and PV1D, and a second phase (Phase 2) which includes PV2D, PV3D, PV4D, . . . . Each program-verify iteration in the first phase includes N1=2 program pulses and a verify waveform, and each program-verify iteration in the second phase includes N2=3 program pulses and a verify waveform. N1 and N2 are natural numbers which represent different values of N in different phases. For example, PV0D includes program pulses P40 and P41 and a verify waveform V40, PV1D includes program pulses P42 and P43 and a verify waveform V41, PV2D includes program pulses P44 and P45 and a verify waveform V42, PV3D includes program pulses P46-P48 and a verify waveform V43, and PV4D includes program pulses P49-P51 and a verify waveform V44. In one approach, PV0D-PV2D are the same as PV0A-PV2A, respectively, in FIG. 11A and PV3D and PV4D are the same as PV3B and PV4B, respectively, in FIG. 12A.

Generally, program disturb becomes worse as Vpgm increases. Thus, most of the program disturb is seen at higher Vpgm, e.g., in the later program-verify iterations of a programming operation.

Based on this theory, a programming operation can have a phase in which the number of program pulses per programming portion is lower when Vpgm is relatively low, followed by a phase in which the number of program pulses per programming portion is higher when Vpgm is relatively high. One example, as depicted in FIG. 14A, used two program pulses per programming portion, followed by three program pulses per programming portion. Another example uses one program pulse per programming portion, followed by two program pulses per programming portion, followed by three program pulses per programming portion. Another example uses two program pulses per programming portion, followed by three program pulses per programming portion, followed by four program pulses per programming portion.

On the other hand, near the very last few program-verify iterations, when Vpgm is relatively high, almost all of the storage elements are typically locked out and hence inhibited, which improves Vch clamping significantly. Thus, relatively little program disturb may occur in last few program-verify iterations pulses. Based on this theory, a programming operation can have a first phase in which the number of program pulses per programming portion is lower when Vpgm is relatively low, followed by a second phase in which the number of program pulses per programming portion is relatively high when Vpgm is intermediate, followed by a third phase in which the number of program pulses per programming portion is again lower when Vpgm is relatively higher, such as depicted in FIG. 14B.

FIG. 14B depicts a series of program-verify iterations of a programming operation, where one program pulse per programming portion is used in first and third programming phases, and three program pulses per programming portion are used in a second programming phase.

The programming operation 1420 includes a first phase (Phase 1) which includes program-verify iteration PV0E . . . , starting at an amplitude Vpgm0, a second phase (Phase 2) which includes PV1E . . . , starting at an amplitude Vpgmx, and a third phase (Phase 3) which includes PV2E . . . , starting at an amplitude Vpgmy. Each program-verify iteration in the first and second phases includes exactly one program pulse and a verify waveform, and each program-verify iteration in the second phase includes exactly three program pulses and a verify waveform. For example, PV0E includes program pulse P60 and a verify waveform V60, PV1E includes program pulses P61-P63 and a verify waveform V61, and PV2E includes program pulse P64 and a verify waveform V62.

In another approach, the first and third phases may use 1-2 program pulses per program-verify iteration, while the second phase uses 3-4 program pulses per program-verify iteration. Or, in the third phase, the number of program pulses per program-verify iteration may be intermediate when Vpgm is relatively higher. For instance, the first phase may use 1-2 program pulses per program-verify iteration, while the second phase uses 3-4 program pulses per program-verify iteration, and the third phase uses 2-3 program pulses per program-verify iteration. Other such combinations of different numbers of program pulses per program-verify iteration, at different Vpgm (or equivalently program-verify iteration count) may also be applied.

In the above discussion the number of program pulses per program-verify iteration is the same as the number of storage elements per set, where exactly, or no more than, one storage element per set is selected for each program pulse according to a pattern such as a cyclic pattern.

The transitions between the different phases can occur when a trigger condition is met, such as when a predetermined program-verify iteration count is reached or a condition regarding a verify test is met. The trigger condition can be fixed or adaptive. An example of a fixed approach is to set a fixed program-verify iteration count in a ROM fuse parameter in the memory device. For example, this may indicate that phase 2 begins at program-verify iteration #4, consistent with FIG. 14A. Another fixed program-verify iteration count can be set to indicate that phase 3 begins at program-verify iteration #8, for instance. In these cases, performing the programming portion of a programming-verify iteration is initiated when a threshold number (e.g., 3 or 7) of previous programming-verify iterations of the programming operation have been performed for the group of non-volatile storage elements.

An example of an adaptive approach is to transition between phases based on the result of a verify operation. For example, a transition can be initiated when at least a specified number of the storage elements have reached a target verify level, for one or more specified data states or target verify levels, or, conversely, no more than a specified number of the storage elements have failed to reached a target verify level, based on a fail bit count at the verify operation.

Further details regarding a cyclic pattern for programming are provided in FIGS. 15A-15D. The patterns are shown by tables which include N sets, a counter (e.g., a cyclic index i), and a pulse index K representing a program pulse in a program-verify iteration. With BLn as a reference bit line, we can define: first degree (primary) neighbors as BLn−1 and BLn+1, second degree (secondary) neighbors as BLn−2 and BLn+2, third degree (tertiary) neighbors as BLn−3 and BLn+3, fourth degree neighbors as BLn−4 and BLn+4 and so forth. A value of "1" denotes a NAND string which is forcibly inhibited by setting Vbl=Vdd (a relatively high power supply level). A value of "0" denotes a NAND string which will either allow programming (e.g., by setting Vbl=0 V or other low level) or be inhibited (e.g., by setting Vbl=Vdd) depending on whether the storage element has reached its target verify level; i.e., a storage element that has not yet reached its target verify level will be allowed to program, while a storage element that has reached its target verify level will be inhibited, as usual. Each row of the tables represents a unique repeating element of sets of NAND strings/bit lines.

N=1 is a default programming mode. FIG. 15A depicts a cyclic programming pattern with N=2 storage elements per set. N=2 ensures that, when the first degree neighbor channel is grounded on one side of a subject unselected storage element, then on the other side, at least the other first degree neighbor channel is boosted. Within the unique repeating element, the bit lines are split into two sets comprising two bit lines each (two pairs). Note that the cyclic pattern described in FIG. 15A matches with that of FIG. 11B.

FIG. 15B depicts a cyclic programming pattern with N=3 storage elements per set. N=3 ensures that, when the first degree neighbor channel is grounded on one side of a subject unselected storage element, then on the other side, at least the first and second degree neighbor channels are boosted. Within the unique repeating element, the bit lines are split into three sets comprising three bit lines each (three triplets). Note that the cyclic pattern described in FIG. 15B matches with that of FIG. 12B.

FIG. 15C depicts a cyclic programming pattern with N=4 storage elements per set. N=4 ensures that, when the first degree neighbor channel is grounded on one side of a subject unselected storage element, then on the other side, at least the first, second and third degree neighbor channels are boosted. Within the unique repeating element, the bit lines are split into four sets comprising four bit lines each (four quadruplets). Note that the cyclic pattern described in FIG. 15C matches with that of FIG. 13B.

FIG. 15D depicts a cyclic programming pattern for a general case of N storage elements per set. The general case for N ensures that, when the first degree neighbor channel is grounded on one side of a subject unselected storage element, then on the other side, at least the first, second, third ... N−1th degree neighbor channels are boosted. Within the unique repeating element, the bit lines are split into N sets comprising N bit lines each.

As a generalized expression, in order to ensure that, for any given NAND string in the array, when, on a first side of a subject unselected storage element, a first degree neighbor is programmed, then on the other side, at least 1st, 2nd, 3rd, ... N−1th degree neighbor channels will be boosted: (1) Divide the entire NAND string array into unique repeating elements, with each unique element comprising N^2 (N×N) NAND strings, (2) Divide each of the unique element into N sets (denoted as Set#1, Set#2 ... Set#N), each comprising N physically adjacent bit lines (the position of the bit lines within each set is denoted as 1, 2 ... N), (3) Split each of the program-verify iterations into N program pulses followed by one verify operation, and (4) For a program-verify iteration, at any given Kth (1=<K<=N) program pulse, within each of the N sets, only one NAND string will be allowed to program (selected), while the rest of the "N−1" NAND strings will be forcibly inhibited (unselected); such that within the Mth set, the position of the programming bit line is given by=1+Mod [(K+M−2), N]. The function Mod [X,Y] (alternatively written as X MOD Y) returns the remainder after dividing X/Y. Further, within the Mth set comprising N bit lines, the position of the first bit line is referred to as "1", while the position of the last bit line is referred as "N".

Figure 16:
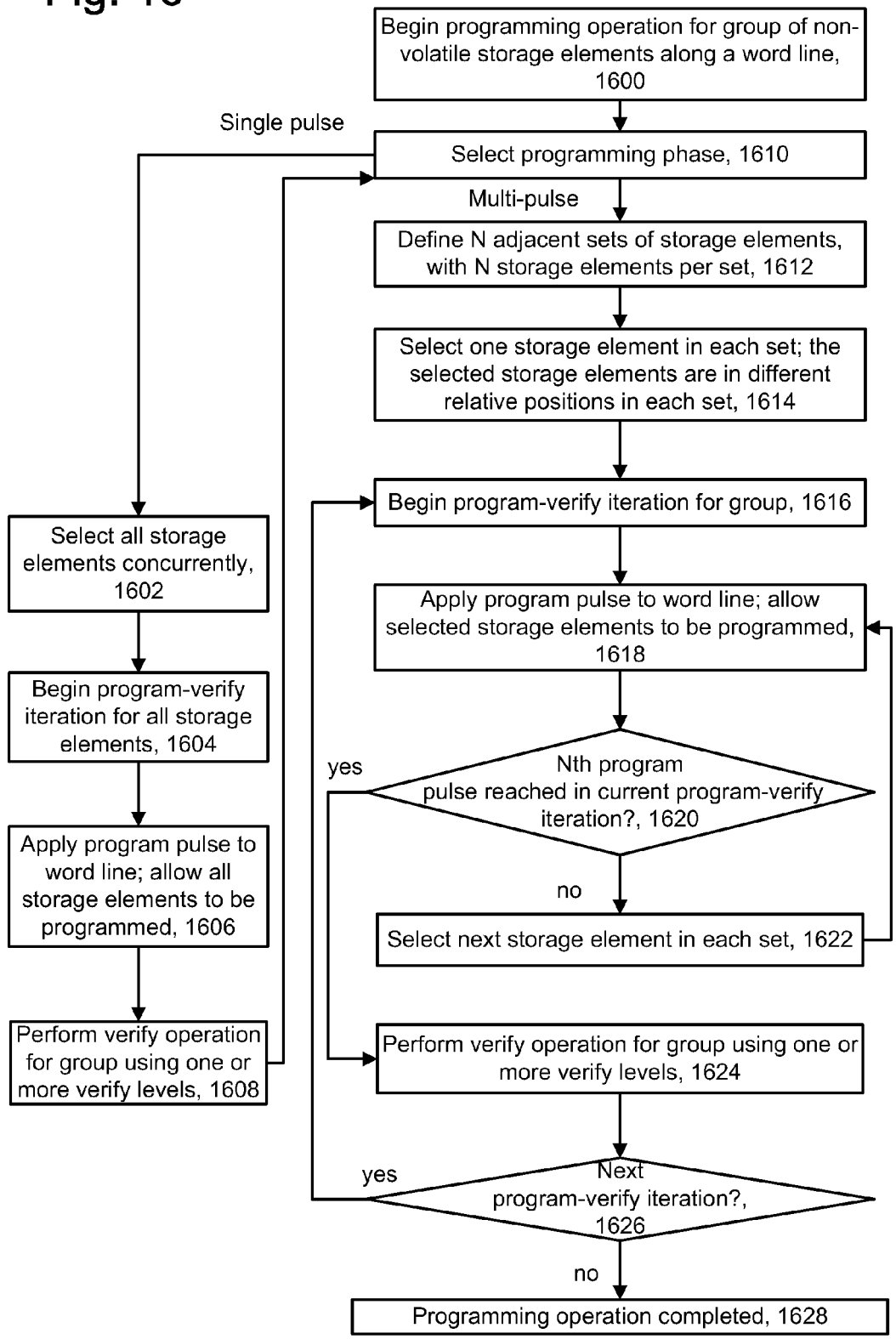
FIG. 16 depicts a programming process in which storage elements in different sets are iteratively selected for programming.

FIG. 16 depicts a programming process in which storage elements in different sets are iteratively selected for programming. The steps include: Begin programming operation for group of non-volatile storage elements along a word line, 1600; Select programming phase, 1610; Select all storage elements concurrently, 1602 (reached if Single pulse phase is selected at step 1610); Begin program-verify iteration for all storage elements, 1604; Apply program pulse to word line; allow all storage elements to be programmed, 1606; Perform verify operation for group using one or more verify levels, 1608; Select programming phase, 1610; Define N adjacent sets of storage elements, with N storage elements per set, 1612 (reached if Multi-pulse phase is selected at step 1610); Select one storage element in each set; the selected storage elements are in different relative positions in each set, 1614; Begin program-verify iteration for group, 1616 (also reached if decision step 1626 is true); Apply program pulse to word line; allow selected storage elements to be programmed, 1618; Nth program pulse reached in current program-verify iteration?, 1620; Select next storage element in each set, 1622 (reached if decision step 1620 is false); Perform verify operation for group using one or more verify levels, 1624 (reached if decision step 1620 is true); Next program-verify iteration?, 1626, and Program operation completed, 1628 (reached if decision step 1626 is false).

Thus, step 1610 selects the programming phase, which can involve one program pulse per program-verify iteration and selection of all storage elements together to be programmed, at steps 1602-1608, or multiple program pulses per program-verify iteration and selection of one storage element per set such as based on a cyclic pattern, at steps 1612-1624. As mentioned earlier, the transitions between the different phases can occur when a fixed or adaptive trigger condition is met. Further, when a programming phase includes multiple (N) program pulses per program-verify iteration, the value of N can be set (e.g., N=1, 2, 3, 4, ... ). Regarding step 1612 and defining N adjacent sets of storage elements, typically there will be many instances of the N sets due to the large number of storage elements associated with a word line, where these instances are adjacent to one another. For example, in FIG. 11B, with N=2, the different instances of the N adjacent sets are formed by S0 and S1, S2 and S3, S4 and S5, and S6 and S7. In FIG. 12B, with N=3, one instance of the N adjacent sets is formed by S0-S2, and another instance is formed by S3, S4 and an additional set (not fully shown) which would be S5 and which would include M15 and two other storage elements. In FIG. 13B, with N=4, one instance of the N adjacent sets is formed by S0-S3. The defining of the sets can involve control parameters which are maintained by a control circuit.

Regarding step 1614, the relative position of the selected storage elements in a set, e.g., with reference to the leftmost storage element in the set, can be the first or second position when N=2, the first, second or third position when N=3, and so forth. The selection of the next storage element in each set at step 1622 can involve, e.g., selecting the storage element which is one position to the right of the currently selected storage element, or if the currently selected storage element is the rightmost storage element in a set, selecting the leftmost storage element. The selection of a storage element can be based on the cyclic patterns in FIGS. 15A-15D, for instance. Alternatively, the next storage element is more than one position to the right or left of the currently selected storage element.

Figure 17:
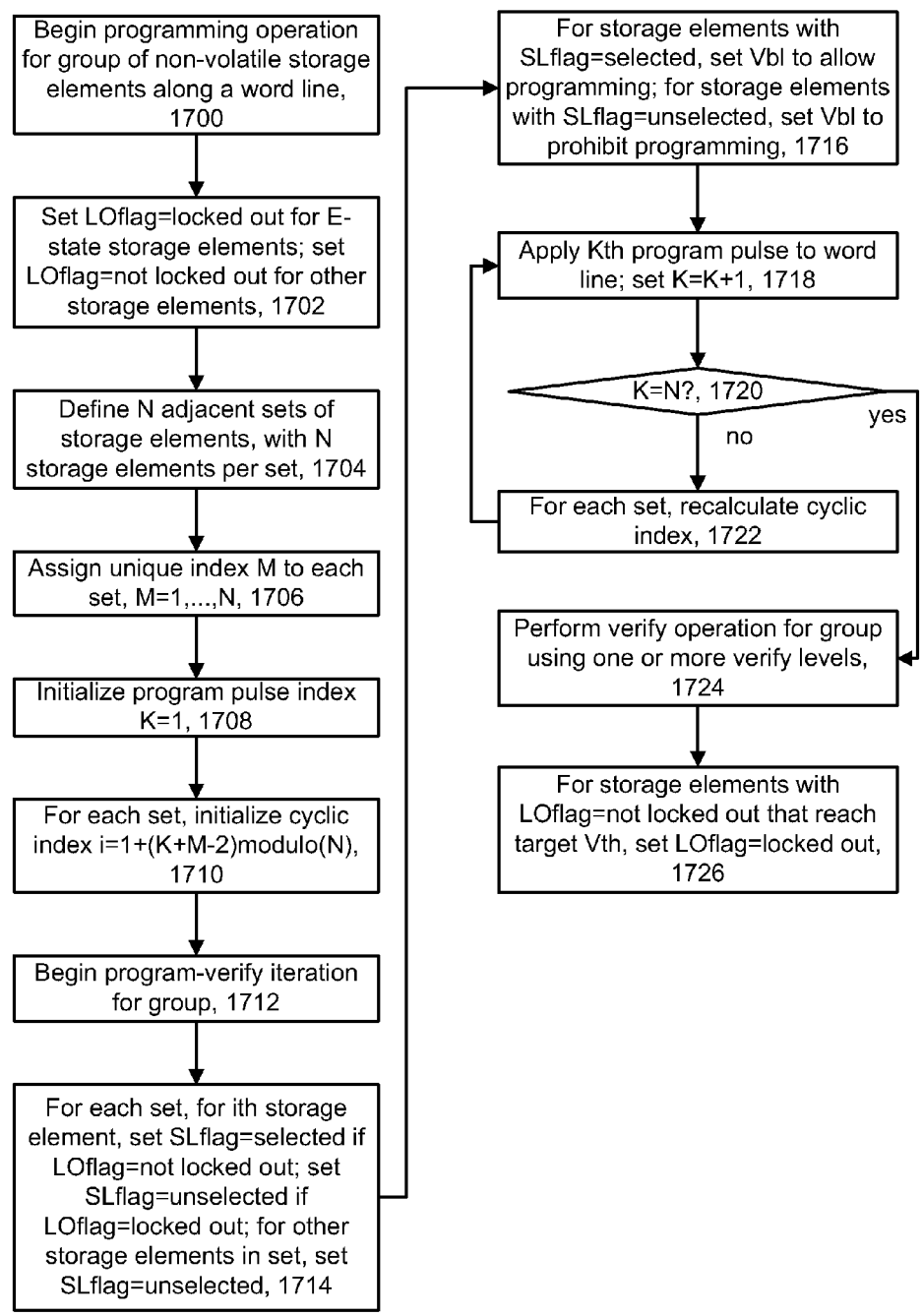
FIG. 17 depicts a programming process which is an embodiment of the multi-pulse branch of the programming process of FIG. 16.

FIG. 17 depicts a programming process which is an embodiment of the multi-pulse branch of the programming process of FIG. 16, where N is the number of program pulses in each of the program-verify iteration of the multi-pulse programming phase. The steps include: Begin programming operation for group of non-volatile storage elements along a word line, 1700; Set LOflag=locked out for E-state storage elements (storage element targeted for the erased state); set LOflag=not locked out for other storage elements (storage elements targeted for a programmed state), 1702; Define N adjacent sets of storage elements, with N storage elements per set, 1704; Assign unique index M to each set, M=1, ..., N, 1706; Initialize program pulse index K=1, 1708; For each set, initialize cyclic index i=1+(K+M−2)modulo(N), 1710; Begin program-verify iteration for group, 1712; For each set, for ith storage element, set SLflag=selected if LOflag=not locked out; set SLflag=unselected if LOflag=locked out; for other storage elements (i.e., other than the ith storage element) in set, set SLflag=unselected, 1714; For storage elements with SLflag=selected, set their associated bit line voltages (Vbl) to allow programming; for storage elements with SLflag=unselected, set their associated bit lines voltages (Vbl) to prohibit programming, 1716; Apply Kth program pulse to word line; set K=K+1, 1718; K=N?, 1720; For each set, recalculate cyclic index, 1722 (reached if decision step 1720 is false); Perform verify operation for group using one or more verify levels, 1724 (reached if decision step 1720 is true); and For storage elements with LOflag=not locked out that reach target Vth, set LOflag=locked out, 1726.

In this implementation, a lockout status is maintained for each storage element as a flag called LOflag, which generally persists over the programming operation, and a selected status is maintained for each storage element as a flag called SLflag, which generally applies to one program pulse within a program-verify iteration. Typically, at the start of a programming operation, all of the storage elements (except those targeted for erased state) have LOflag=not locked out and SLflag=unselected. As the programming operation proceeds, some of the storage elements will transition to LOflag=locked out. In a program-verify iteration, a storage element with LOflag=locked out will have SLflag=unselected even if it is that storage element's turn to be selected according to the cyclic pattern.

An example of step 1706 is, for case N=2, setting an index M=1-2 to sets S0-S1, respectively, in FIG. 11B, or, for case N=3, setting an index M=1-3 to sets S0-S2, respectively, in FIG. 12B, or, for case N=4, setting an index M=1-4 to sets S0-S3, respectively, in FIG. 13B.

In step 1708, the program pulse index is the number of the program pulse within a program-verify iteration. For example, in FIG. 11A, K=1 for P0, P2 and P4, and K=2 for P1, P3 and P5. In FIG. 12A, K=1 for P10, P13, P16, P19 and P22, K=2 for P11, P14, P17, P20 and P23, and K=3 for P12, P15, P18, P21 and P24. In FIG. 13A, K=1 for P20, P24, P28 and P32, K=2 for P21, P25, P29 and P33, K=3 for P22, P26, P30 and P34, and K=4 for P23, P27, P31 and P35.

Regarding step 1710, a modulo function describes a rotational or cyclic pattern, such as described in FIGS. 15A-15D. The cyclic index i represents the relative position of the currently selected storage element within its set, e.g., first (leftmost), second, third and so forth. As an example, with N=3, and M=1 for an example set (e.g., S0 in FIG. 12B), i=1+(K+M−2)modulo(N)=1+(1+1−2)modulo3=1+0modulo3=1+0=1 for the first program pulse (K=1). Thus, the first or leftmost storage element in set 1 (M0) is selected for the first program pulse (K=1). For the second program pulse (K=2), i=1+(K+M−2)modulo(N)=1+(2+1−2)modulo3=1+1modulo3=1+1=2, so the second storage element (M1) in set 1 is selected. For the third program pulse (K=3), i=1+(K+M−2)modulo(N)=1+(3+1−2)modulo3=1+2modulo3=1+2=3, so the third storage element (M2) in set 1 is selected. Also, consider M=2 for another example set (e.g., S1 in FIG. 12B), i=1+(K+M−2)modulo(N)=1+(1+2−2)modulo3=1+1modulo3=1+1=2 for the first program pulse (K=1). Thus, the second storage element (M4) in set 2 is selected for the first program pulse (K=1).

For the second program pulse (K=2), i=1+(K+M−2)modulo(N)=1+(2+2−2)modulo3=1+2modulo3=1+2=3, so the third storage element (M5) in set 2 is selected. For the third program pulse (K=3), i=1+(K+M−2)modulo(N)=1+(3+2−2)modulo3=1+3modulo3=1+0=1, so the first storage element (M3) in set 2 is selected. The use of the modulo function is an example implementation and other implementations are possible.

The recalculation of the cyclic index in step 1722 can occur in the same manner as in step 1710, but with K incremented (at step 1718).

Accordingly, it can be seen that a method is provided for performing a programming operation for a group of non-volatile storage elements in communication with a word line. The method includes: (a) performing a programming portion of a program-verify iteration of the programming operation, the performing the programming portion comprises: applying N successive programming pulses to the word line, the group comprises N adjacent sets of non-volatile storage elements, each of the N adjacent sets comprises N adjacent non-volatile storage elements, and N is a natural number of three or more; and for each of the N successive programming pulses, selecting one of the non-volatile storage elements in each of the N adjacent sets according to a pattern which indicates a relative position of the selected one of the non-volatile storage elements in each of the N adjacent sets, the relative position is different for each of the N adjacent sets, allowing the selected one of the non-volatile storage elements in each of the N adjacent sets to program if a threshold voltage of the selected one of the non-volatile storage elements in each of the N adjacent sets has not yet reached a target verify level, and prohibiting unselected non-volatile storage elements in each of the N adjacent sets from programming regardless of whether threshold voltages of the unselected non-volatile storage elements in each of the N adjacent sets have reached respective target verify levels. The method further includes (b) subsequently performing a verify operation of the program-verify iteration for the group.

In another embodiment, a non-volatile storage system comprises a group of non-volatile storage elements, the group comprises N adjacent sets of non-volatile storage elements, each of the N adjacent sets comprises N adjacent non-volatile storage elements, and N is a natural number of three or more; a word line in communication with the group of non-volatile storage elements, the non-volatile storage elements are arranged side by side along the word line; and a control circuit. The control circuit, to perform a programming portion of a program-verify iteration of a programming operation: applies N successive programming pulses to the word line; for each of the N successive programming pulse, selects one of the non-volatile storage elements in each of the N adjacent sets according to a pattern which guarantees that each unselected non-volatile storage element has at least one of: (a) on one side, a first degree neighbor unselected non-volatile storage element and the adjoining second degree, . . . N−1th degree neighbor unselected non-volatile storage elements, and (b) on an opposing side, a primary neighbor unselected non-volatile storage element; and allows the selected one of the non-volatile storage elements in each of the N adjacent sets to program if a threshold voltage of the selected one of the non-volatile storage elements in each of the N adjacent sets has not yet reached a target verify level, and prohibits unselected non-volatile storage elements in each of the N adjacent sets from programming regardless of whether threshold voltages of the unselected non-volatile storage elements in each of the N adjacent sets have reached respective target verify levels. The control circuit subsequently performs a verify operation of the program-verify iteration for the group.

In another embodiment, a method is provided for performing a programming operation for a group of non-volatile storage elements in communication with a word line. The method includes: performing a programming portion of a program-verify iteration of the programming operation, the performing the programming portion comprises: applying N1 successive programming pulses to the word line, the group comprises N1 adjacent sets of non-volatile storage elements, each of the N1 adjacent sets comprises N1 adjacent non-volatile storage elements, and N1 is a natural number of three or more; subsequently performing a verify operation of the another program-verify iteration for the group; for each of the N1 successive programming pulses, selecting one of the non-volatile storage elements in each of the N1 adjacent sets according to a respective modulo function which indicates a relative position of the selected one of the non-volatile storage elements in each of the N1 adjacent sets, the relative position is different for each of the N1 adjacent sets, allowing the selected one of the non-volatile storage elements in each of the N1 adjacent sets to program if the selected one of the non-volatile storage elements in each of the N1 adjacent sets has not yet reached a lockout condition; and prohibiting unselected non-volatile storage elements in each of the N1 adjacent sets from programming regardless of whether threshold voltages of the unselected non-volatile storage elements in each of the N1 adjacent sets have reached the lockout condition. The method further includes subsequently performing a verify operation of the another program-verify iteration for the group.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for performing a programming operation for a group of non-volatile storage elements in communication with a word line, comprising:
    performing a programming portion of a program-verify iteration of the programming operation, the performing the programming portion comprises:
        applying N successive programming pulses to the word line, the group comprises N adjacent sets of non-volatile storage elements, each of the N adjacent sets comprises N adjacent non-volatile storage elements, and N is a natural number of three or more; and
        for each of the N successive programming pulses, selecting one of the non-volatile storage elements in each of the N adjacent sets according to a pattern which indicates a relative position of the selected one of the non-volatile storage elements in each of the N adjacent sets, the relative position is different for each of the N adjacent sets, allowing the selected one of the non-volatile storage elements in each of the N adjacent sets to program if a threshold voltage of the selected one of the non-volatile storage elements in each of the N adjacent sets has not yet reached a target verify level, and prohibiting unselected non-volatile storage elements in each of the N adjacent sets from programming regardless of whether threshold voltages of the unselected non-volatile storage elements in each of the N adjacent sets have reached respective target verify levels; and
    subsequently performing a verify operation of the program-verify iteration for the group.

2. The method of claim 1, further comprising:
performing a verify operation of the program-verify iteration for the group after the N programming pulses have been applied to the word line.

3. The method of claim 1, wherein:
the selecting selects only one of the non-volatile storage elements in each of the N adjacent sets.

4. The method of claim 3, wherein:
the pattern uses a cyclic index.

5. The method of claim 1, wherein:
for the programming portion, the relative position in one of the N adjacent sets is shifted by one or more non-volatile storage elements along the word line.

6. The method of claim 1, wherein:
the non-volatile storage elements are arranged side by side along the word line; and
for the programming portion, each unselected non-volatile storage element is guaranteed to have at least one of: (a) on one side, a first degree neighbor unselected non-volatile storage element and adjoining second degree, . . . N−1th degree unselected non-volatile storage elements, or (b) on an opposing sides, a first degree neighbor unselected non-volatile storage element.

7. The method of claim 1, wherein:
the performing the programming portion is initiated when a threshold number of previous program-verify iterations of the programming operation have been performed for the group of non-volatile storage elements.

8. The method of claim 7, wherein:
the previous program-verify iterations each comprise a single program pulse, an amplitude of the program pulse is stepped up in the previous programming iterations until the amplitude reaches a threshold amplitude; and the performing the programming portion is initiated when the amplitude of the program pulse reaches the threshold amplitude.

9. The method of claim 1, wherein:

the N successive programming pulses have a common amplitude; and the common amplitude is stepped up in a plurality of successive program-verify iterations of the programming operation.

10. The method of claim 1, wherein:

the allowing the selected one of the non-volatile storage elements in each of the N adjacent sets to program comprises setting an associated bit line voltage at a level which allows programming; and the prohibiting the unselected non-volatile storage elements in each of the N adjacent sets from programming comprises setting an associated bit line voltage at a level which inhibits programming.

11. A non-volatile storage system, comprising:

a group of non-volatile storage elements, the group comprises N adjacent sets of non-volatile storage elements, each of the N adjacent sets comprises N adjacent non-volatile storage elements, and N is a natural number of three or more;

a word line in communication with the group of non-volatile storage elements, the non-volatile storage elements are arranged side by side along the word line; and a control circuit, the control circuit, to perform a programming portion of a program-verify iteration of a programming operation: applies N successive programming pulses to the word line; for each of the N successive programming pulse, selects one of the non-volatile storage elements in each of the N adjacent sets according to a pattern which guarantees that each unselected non-volatile storage element has at least one of: (a) on one side, a first degree neighbor unselected non-volatile storage element and adjoining second degree, . . . N−1th degree neighbor unselected non-volatile storage elements, or (b) on an opposing side, a primary neighbor unselected non-volatile storage element; and allows the selected one of the non-volatile storage elements in each of the N adjacent sets to program if a threshold voltage of the selected one of the non-volatile storage elements in each of the N adjacent sets has not yet reached a target verify level, and prohibits unselected non-volatile storage elements in each of the N adjacent sets from programming regardless of whether threshold voltages of the unselected non-volatile storage elements in each of the N adjacent sets have reached respective target verify levels, and the control circuit subsequently performs a verify operation of the program-verify iteration for the group.

12. The non-volatile storage system of claim 11, wherein:

the circuit performs a verify operation of the program-verify iteration for the group after the N programming pulses have been applied to the word line.

13. The non-volatile storage system of claim 11, wherein:

the circuit, for each of the N successive programming pulses, selects the one of the non-volatile storage elements in each of the N adjacent sets according to the pattern, the pattern indicates a relative position of the selected one of the non-volatile storage elements in each of the N adjacent sets, and the relative position is different for each of the N adjacent sets.

14. The non-volatile storage system of claim 11, wherein:

to allow the selected one of the non-volatile storage elements in each of the N adjacent sets to program, the circuit sets an associated bit line voltage at a level which allows programming; and to prohibit the unselected non-volatile storage elements in each of the N adjacent sets from programming, the circuit sets an associated bit line voltage at a level which inhibits programming.

15. The non-volatile storage system of claim 11, wherein:

the non-volatile storage elements are in respective NAND strings.

16. The non-volatile storage system of claim 11, wherein:

the circuit selects only one of the non-volatile storage elements in each of the N adjacent sets.

17. A method for performing a programming operation for a group of non-volatile storage elements in communication with a word line, comprising:

performing a programming portion of a program-verify iteration of the programming operation, the performing the programming portion comprises:

applying N1 successive programming pulses to the word line, the group comprises N1 adjacent sets of non-volatile storage elements, each of the N1 adjacent sets comprises N1 adjacent non-volatile storage elements, and N1 is a natural number of three or more;

for each of the N1 successive programming pulses, selecting one of the non-volatile storage elements in each of the N1 adjacent sets according to a respective modulo function which indicates a relative position of the selected one of the non-volatile storage elements in each of the N1 adjacent sets, the relative position is different for each of the N1 adjacent sets, allowing the selected one of the non-volatile storage elements in each of the N1 adjacent sets to program if the selected one of the non-volatile storage elements in each of the N1 adjacent sets has not yet reached a lockout condition; and prohibiting unselected non-volatile storage elements in each of the N1 adjacent sets from programming regardless of whether threshold voltages of the unselected non-volatile storage elements in each of the N1 adjacent sets have reached the lockout condition; and subsequently performing a verify operation of the program-verify iteration for the group.

18. The method of claim 17, further comprising:

performing a programming portion of another program-verify iteration of the programming operation, the performing the programming portion of the another program-verify iteration comprises:

applying N2 successive programming pulses to the word line, the group comprises N2 adjacent sets of non-volatile storage elements, each of the N2 sets comprises N2 adjacent non-volatile storage elements, and N2 is a natural number of two or more and N2 does not equal N1;

for each of the N2 successive programming pulses, selecting one of the non-volatile storage elements in each of the N2 sets according to a respective modulo function which indicates a relative position of the selected one of the non-volatile storage elements in each of the N2 adjacent sets, the relative position is different for each of the N2 adjacent sets, allowing the selected one of the non-volatile storage elements in each of the N2 sets to program if the selected one of the non-volatile storage elements in each of the N2 sets has not yet reached the lockout condition, and prohibiting unselected non-volatile storage elements in each of the N2 sets from programming regardless of whether the unselected non-volatile storage elements in each of the N2 sets have reached the lockout condition; and subsequently performing a verify operation of the another program-verify iteration for the group.

19. The method of claim 18, further comprising:

performing a single-program pulse programming portion of an additional program-verify iteration of the programming operation; and subsequently performing a verify operation of the additional program-verify iteration for the group.

20. The method of claim 17, wherein:

the selecting selects only one of the non-volatile storage elements in each of the N1 adjacent sets.

21. The method of claim 18, wherein:

the selecting selects only one of the non-volatile storage elements in each of the N2 adjacent sets.

* * * * *